United States Patent
Roy et al.

(10) Patent No.: US 6,195,613 B1
(45) Date of Patent: Feb. 27, 2001

(54) METHOD AND SYSTEM FOR MEASURING EQUIVALENT SERIES RESISTANCE OF CAPACITORS AND METHOD FOR DECOUPLING POWER DISTRIBUTION SYSTEMS

(75) Inventors: Tanmoy Roy, Mountain View; Larry D. Smith, San Jose; Raymond E. Anderson, Santa Cruz; Thomas J. Pelc, Fremont; Douglas W. Forehand, Mountain View, all of CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/149,164
(22) Filed: Sep. 8, 1998

Related U.S. Application Data

(63) Continuation-in-part of application No. 09/099,548, filed on Jun. 18, 1998, and a continuation-in-part of application No. 09/099,547, filed on Jun. 18, 1998.

(51) Int. Cl.$^7$ ............................ G01R 27/00; H01G 4/228
(52) U.S. Cl. ..................... 702/65; 702/106; 361/306.2; 324/654
(58) Field of Search .............................. 702/65, 106, 191; 324/649, 650, 654, 717, 707, 430; 361/306.2, 321.4, 684

(56) References Cited

U.S. PATENT DOCUMENTS 4,835,464 * 5/1989 Slye et al. ............................ 324/763
4,879,631 * 11/1989 Johnson et al. .................... 361/321.4

(List continued on next page.)

FOREIGN PATENT DOCUMENTS 0 472 317    2/1992   (EP) .

OTHER PUBLICATIONS

Chen et al., "Optimum Placement of Decoupling Capacitors on Packages and Printed Circuit Boards Under the Guidance of Electromagnetic Field Simulations," 1996 Electronic Components and Technology Conference, May 1996, pp. 756–760.

(List continued on next page.)

Primary Examiner—Marc S. Hoff
Assistant Examiner—Bryan Bui
(74) Attorney, Agent, or Firm—Conley, Rose & Tayon, PC; B. Noël Kivlin

(57) ABSTRACT

A system and method for measuring the equivalent series resistance (ESR) of one or more capacitors using an impedance analyzer, whereby the capacitors are joined to the impedance analyzer with a conductive adhesive. The conductive adhesive may advantageously provide for an electrically and mechanically stable connection between the capacitor and the remainder of the electrical circuit used to measure the ESR of the capacitor. The conductive adhesive may include heat activated or cold solder, or conductive putty. The system comprises a measuring unit for sweeping a frequency range to find the minimum impedance for the capacitor and a connector assembly for holding the capacitor in an electrically and mechanically stable connection using the conductive adhesive. The connector assembly includes a mating portion adapted for electrically connecting the connector assembly to an I/O port of the measuring unit and a terminal portion that accommodates a connection to the capacitor using the conductive adhesive. The method comprises connecting a mating portion of the connector assembly to the impedance analyzer. Next, the impedance analyzer is calibrated, and the capacitor is then connected to a terminal portion of the connector assembly using the conductive adhesive. Finally, the impedance analyzer sweeps a frequency range to find the ESR for the capacitor. The method may also measure the ESR of each of a number of capacitors using an impedance analyzer. The method may connect in series the number of capacitors to the connector assembly using the conductive adhesive. The method determines the equivalent series resistance of each of the number of capacitors by dividing the minimum impedance by the number of capacitors. The method may also comprise selecting one or more capacitors, measuring the ESR of each of the capacitors, and determining a desired number of each of the capacitors for placing into a power distribution system.

20 Claims, 13 Drawing Sheets

U.S. PATENT DOCUMENTS

| | | | | |
|---|---|---|---|---|
| 4,970,460 | * | 11/1990 | Jensen et al. | 324/754 |
| 5,428,499 | * | 6/1995 | Szerlip et al. | 361/328 |
| 5,566,083 | | 10/1996 | Fang . | |
| 5,717,336 | * | 2/1998 | Basell et al. | 324/650 |
| 5,744,972 | * | 4/1998 | Korenivski et al. | 324/649 |
| 5,789,964 | * | 8/1998 | Voldman | 327/380 |
| 6,023,408 | * | 2/2000 | Schaper | 361/306.2 |

OTHER PUBLICATIONS

Ingels et al., "Design Strategies and Decoupling Techniques for Reducing the Effects of Electrical Interference in Mixed–Mode IC's," IEEE Journal of Solid–State Circuits, vol. 32, No. 7, Jul. 1997, pp. 1136–1141.

Chen et al., "On–chip decoupling capacitor optimization for high–performance VLSI design," 1995 International Symposium on VLSI Technology, Systems, and Applications, May 1995, pp. 99–103.

* cited by examiner

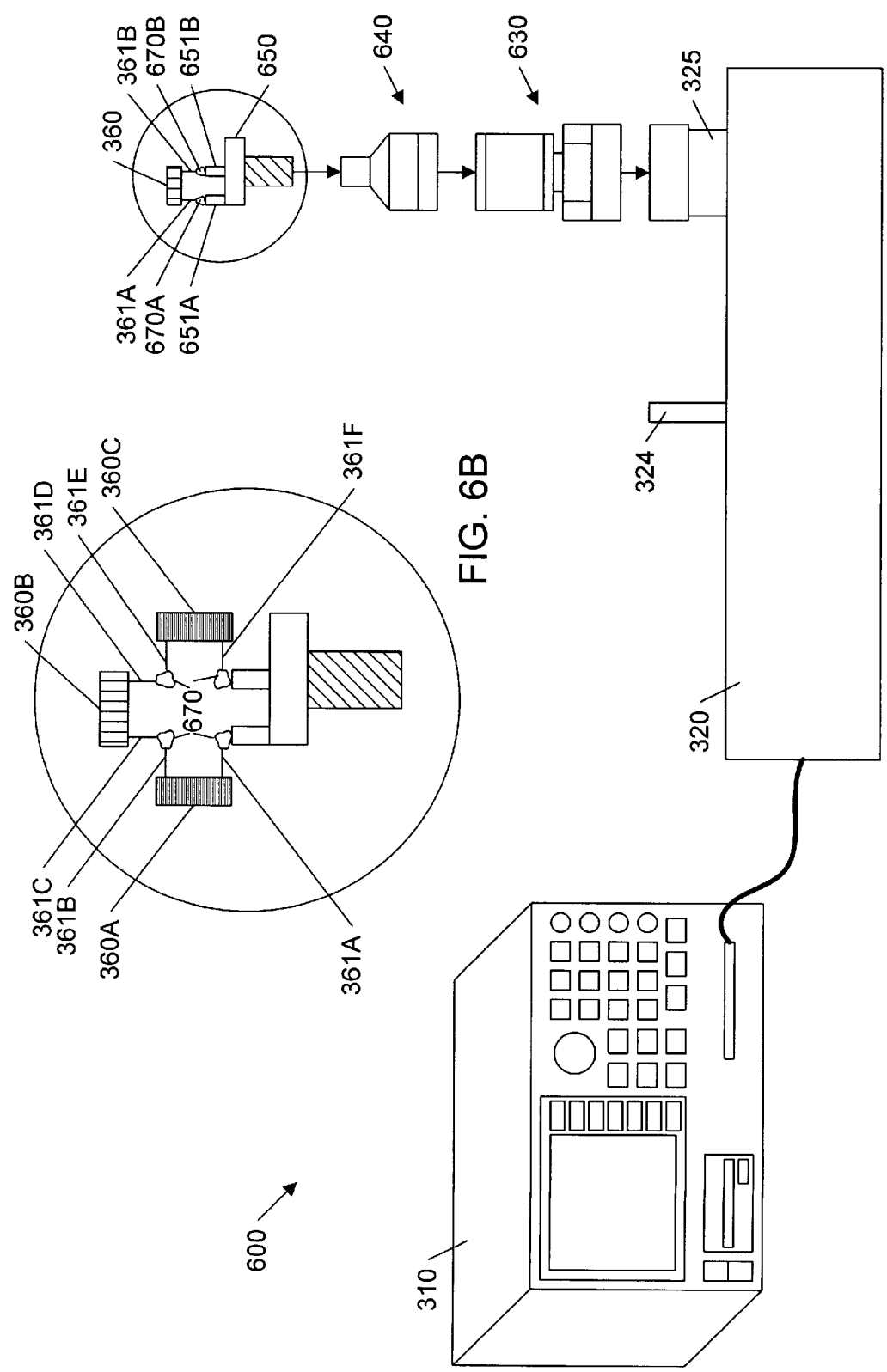

METHOD AND SYSTEM FOR MEASURING EQUIVALENT SERIES RESISTANCE OF CAPACITORS AND METHOD FOR DECOUPLING POWER DISTRIBUTION SYSTEMS

CONTINUATION DATA

This is a continuation-in-part of co-pending U.S. patent application Ser. No. 09/099,548, "Method for Determining the Desired Decoupling Components for Power Distribution Systems", filed on Jun. 18, 1998, whose inventors are Raymond E. Anderson, Larry D. Smith, Tanmoy Roy, and Cornelius B. O'Sullivan; and a continuation-in-part of co-pending U.S. patent application Ser. No. 09/099,547, entitled "Method for Determining the Desired Decoupling Components for Power Distribution Systems Using a Computer System", filed on Jun. 18, 1998, whose inventors are Raymond E. Anderson and Larry D. Smith.

BACKGROUND OF THE INVENTION

1. Field of the Invention

This invention relates to measurement techniques, and more particularly to measuring equivalent series resistance of capacitors. This invention further relates to selecting decoupling components for power distribution systems.

2. Description of the Related Art

Electronic systems typically employ several different types of electrical interconnecting apparatus having planar layers of electrically conductive material (i.e., planar conductors) separated by dielectric layers. A portion of the conductive layers may be patterned to form electrically conductive signal lines or "traces". Conductive traces in different layers (i.e., on different levels) are typically connected using contact structures formed in openings in the dielectric layers (i.e., vias). For example, integrated circuits typically have several layers of conductive traces which interconnect electronic devices formed upon and within a semiconductor substrate. Each layer is separated from adjacent layers by dielectric layers. Within a semiconductor device package, several layers of conductive traces separated by dielectric layers may be used to electrically connect bonding pads of an integrated circuit to terminals (e.g., pins or leads) of the device package. Printed circuit boards (PCBs) also typically have several layers of conductive traces separated by dielectric layers. The conductive traces are used to electrically interconnect terminals of electronic devices mounted upon the PCB.

Signals in digital electronic systems typically carry information by alternating between two voltage levels (i.e., a low voltage level and a high voltage level). A digital signal cannot transition instantaneously from the low voltage level to the high voltage level, or vice versa. The finite amount of time during which a digital signal transitions from the low voltage level to the high voltage level is called the rise time of the signal. Similarly, the finite amount of time during which a digital signal transitions from the high voltage level to the low voltage level is called the fall time of the signal.

Digital electronic systems are continually being produced which operate at higher signal frequencies (i.e., higher speeds). For the digital signals within such systems to remain stable for appreciable periods of time between transitions, the rise and fall times of the signals must decrease as signal frequencies increase. This decrease in signal transition times (i.e., rise and fall times) creates several problems within digital electronic systems, including signal degradation due to reflections, power supply "droop", ground "bounce", and increased electromagnetic emissions. It is desirable that the digital signals are transmitted and received within accepted tolerances.

A signal launched from a source end of a conductive trace suffers degradation when a portion of the signal reflected from a load end of the trace arrives at the source end after the transition is complete (i.e., after the rise time or fall time of the signal). A portion of the signal is reflected back from the load end of the trace when the input impedance of the load does not match the characteristic impedance of the trace. When the length of a conductive trace is greater than the rise time divided by three, the effects of reflections upon signal integrity (i.e., transmission line effects) should be considered. If necessary, steps should be taken to minimize the degradations of signals conveyed upon the trace due to reflections. The act of altering impedances at the source or load ends of the trace in order to reduce signal reflections is referred to as "terminating" the trace. For example, the input impedance of the load may be altered to match the characteristic impedance of the trace in order to prevent signal reflection. As the transition time (i.e., the rise or fall time) of the signal decreases, so does the length of trace which must be terminated in order to reduce signal degradation.

All conductors have a certain amount of inductance. The voltage across the inductance portion of a conductor is directly proportional to the rate of change of current through the conductor. At the high frequencies present in conductors carrying digital signals having short transition times, a significant voltage drop occurs across a conductor having even a small inductance. A power supply conductor connects one terminal of an electrical power supply to a power supply terminal of a device, and a ground conductor connects a ground terminal of the power supply to a ground terminal of the device. When the device generates a digital signal having short transition times, high frequency transient load currents flow in the power supply and ground conductors. Power supply droop is the term used to describe the decrease in voltage at the power supply terminal of the device due to the flow of transient load current through the inductance portion of the power supply conductor. Similarly, ground bounce is the term used to describe the increase in voltage at the ground terminal of the device due to the flow of transient load current through the inductance portion of the ground conductor. When the device generates several digital signals having short transition times simultaneously, the power supply droop and ground bounce effects can be additive. Sufficient power supply droop and ground bounce can cause the device to fail to function correctly.

Power supply droop is commonly reduced by arranging power supply conductors to form a crisscross network of intersecting power supply conductors (i.e., a power supply grid). Such a grid network has a lower inductance, hence power supply droop is reduced. A continuous power supply plane may also be provided which has an even lower inductance than a grid network. Placing a "bypass" capacitor near the power supply terminal of the device is also used to reduce power supply droop. The bypass capacitor supplies a substantial amount of the transient load current, thereby reducing the amount of transient load current flowing through the power supply conductor. Ground bounce is reduced by using a low inductance ground conductor grid network, or a continuous ground plane having an even lower amount of inductance. Power supply and ground grids or planes are commonly placed in close proximity to one another in order to further reduce the inductances of the grids or planes.

FIG. 1 is a perspective view of a power distribution system 100 comprising a pair of 10 in.×10 in. square conductive planes 110 and 120 separated by a fiberglass-epoxy composite dielectric layer. Each conductive plane is made of copper and is 0.0014 in. thick. The fiberglass-epoxy composite layer separating the planes has a dielectric constant of 4.0 and is 0.004 in. thick. The electrical impedance between the parallel conductive planes of FIG. 1 varies widely at frequencies above about 200 MHz. The parallel conductive planes exhibit multiple electrical resonances at frequencies between 100 MHz and 1 GHz and above, resulting in alternating high and low impedance values and leading to a varying voltage 130. The parallel conductive planes 110 and 120 of FIG. 1 would also radiate substantial amounts of electromagnetic interference (EMI) at frequencies associated with high electrical impedance between the planes anywhere near their peripheries.

The above problems are currently solved in different ways at different frequency ranges. At low frequency, the power supply uses a negative feedback loop to reduce fluctuations. At higher frequencies, large value bypass (i.e. decoupling) capacitors are placed near devices. At the highest frequencies, very small bypass capacitors are placed very close to devices in an attempt to reduce their parasitic inductance, and thus high frequency impedance, to a minimum value.

The parameters of particular interest in selecting decoupling capacitors are the magnitude of the impedance minimum of each decoupling capacitor as a function of frequency [referred to as the equivalent series resistance (ESR)], and the frequency at which the ESR occurs [referred to as the resonance frequency]. The accurate measurement of ESR for capacitors is paramount in deciding the number of capacitors to be used on high-speed electronic circuit boards to reduce noise on power distribution system power planes. The total number of capacitors is also used by board designers to achieve an overall maximum, or target, impedance for the board, often as a function of frequency.

Accuracy in measuring the ESR can directly impact the cost of manufacturing the PCB. High ESR estimates will overpredict the number of capacitors needed, thus significantly reducing the board space. Using too many capacitors also increases the cost of manufacturing the PCB. Low ESR estimates will underpredict the number of capacitors to be mounted in the power distribution system. Too few capacitors may lower the reliability of the PCB. If the uncertainty in the ESR is high, extra capacitors may have to be added to ensure the reliability of the PCB, again also increasing the cost of manufacturing.

Choosing the needed decoupling for the power distribution system may be obtained using a model for the power distribution system as shown in FIG. 2. A switching power supply 210 supplies current and voltage to a CMOS chip load 220. In parallel with the power supply 210 and the load 220 are decoupling capacitors 215, [shown with inductive L, capacitive C, and resistive R components] and the PCB 225 itself, with its own capacitance. Modeling a constant current of one ampere through the power supply 210 permits changes in the impedance as a function of frequency to be identified by changes in the voltage across the power supply 210. Determining the proper values for decoupling capacitors and the optimum number of each has been a "trial and error" process, which relies on the experience of the designer. There have been no known straightforward rules for choosing decoupling capacitors for all frequency ranges.

Currently, the industry and capacitor manufacturers use a procedure to measure the ESR of capacitors that is given in the operating manual of the HEWLETT PACKARD HP 4291A RF Impedance/Material Analyzer. One set-up using the HP 4291A is shown in FIG. 3. Prior art measuring system 300 comprises the HP 4291A mainframe 310 connected to a test station 320, which includes a support 324. A test head with an APC-7 connector 325 attaches to the test station 320. A test fixture 331, preferably an HP 16192C, may be screwed onto the test station 320 at support 324 and connects electrically to the test head APC-7 connector 325 through APC-7 connector 326.

The test fixture 331 includes outer electrodes 340A and 340C and inner electrode 340B for electrically connecting a device under test (DUT) 360 into the measuring system 300 through leads 361A and 361B. When a DUT (i.e. a capacitor) 360 is placed in position to have its impedance measured, lead 361A is placed in contact with outer electrode 340A and lead 361B is placed in contact with inner electrode 340B. Arms 365A and 365B are moved inward to mechanically secure the capacitor 360 in place. Other test fixtures 331 include springs or spring clips instead of arms 365A and 365B to mechanically secure the capacitor 360 in place during measurement. Compensation must be made in most cases for OPEN/SHORT circuit and electrical lengths.

Problems may arise when attempting to measure the ESR of capacitors above about 10 $\mu$F. These capacitors typically have ESRs in the range ~10–20 m$\Omega$. This extremely low range for the ESR measurements often brings the accuracy and/or precision of the measuring device into question.

It has been determined by the present inventors that there are problems with reproducibility when using the industry standard procedure for measuring the ESR of capacitors, including measurement errors of 15% or more. The present inventors have determined that the electrical connection between the capacitor and the test head may account for the large uncertainty in the ESR measurements. It would thus be desirable to have a system and method for measuring more accurately the ESR of capacitors to be used for decoupling power distribution systems. The method is preferably compatible with established measurement devices, such as the HEWLETT PACKARD HP 4291A RF Impedance/Material Analyzer. It would further be desirable to integrate the method for more accurately measuring the ESR into a method for designing the power distribution system and determining the desired decoupling components for stabilizing the electrical impedance in the power distribution system. The method is preferably automatable, to the extent possible, using a computer system to perform calculations.

SUMMARY OF THE INVENTION

The problems with reproducibility in measuring the ESR of capacitors outlined above are in large part solved by a system and method for measuring the equivalent series resistance of one or more capacitors using an impedance analyzer, whereby the capacitors are joined to the impedance analyzer with a conductive adhesive. The conductive adhesive may advantageously provide for an electrically and mechanically stable connection between the capacitor and the remainder of the electrical circuit used to measure the ESR of the capacitor. The conductive adhesive may be solder.

In one embodiment, the system for measuring the equivalent series resistance of a capacitor comprises a measuring unit for sweeping a frequency range to find the minimum impedance for the capacitor and a connector assembly for holding the capacitor in an electrically and mechanically stable connection using the conductive adhesive. The connector assembly includes a mating portion adapted for electrically connecting the connector assembly to an I/O port of the measuring unit and a terminal portion that accommodates a connection to the capacitor using the conductive adhesive. The measuring unit may be the HP 4291A, and the connector assembly may include an APC-7 to N male connector, an N male to SMA male adaptor, and an SMA female bulkhead connector. The conductive adhesive may include heat activated or cold solder, or a conductive putty.

A method is also contemplated wherein, in one embodiment, a mating portion of a connector assembly is connected to a input/output port of an impedance analyzer. The impedance analyzer is calibrated, and the capacitor is connected to a terminal portion of the connector assembly using the conductive adhesive. Finally, the impedance analyzer sweeps a frequency range to find the ESR for the capacitor. In another embodiment, the method measures the equivalent series resistance of each of a number of capacitors (i.e. a group of capacitors) simultaneously using an impedance analyzer. The capacitors are connected in series to the mating portion of the connector assembly using the conductive adhesive. After determining the minimum impedance of the number of capacitors over the frequency range, the equivalent series resistance of each of the number of capacitors is determined by dividing the minimum impedance by the number of capacitors. Difficulties encountered in measuring the ESR of a single low ESR capacitor may be overcome by measuring the group of capacitors simultaneously. The group has a collective ESR higher than the ESR of each individual capacitor. The higher ESR of the group preferably moves the ESR measurement into a more accurate or precise region of the impedance analyzer.

In a further embodiment, calibrating the impedance analyzer includes calibrating with a short circuit, an open circuit, and a test load with known impedance, such as 50 ohms. In another embodiment, the conductive adhesive is semi-permanent. In one embodiment, the method further includes a post-sweeping calibration check. A preferred calibration check compares the phase shift at the minimum impedance to 180 degrees. In another embodiment, sweeping a frequency range with the impedance analyzer includes averaging multiple sweeps through the frequency range with the impedance analyzer.

A method is further contemplated for determining the desired decoupling components, preferably capacitors, for stabilizing the electrical impedance in the power distribution system. The power distribution system is preferably part of an electrical interconnecting apparatus including a pair of parallel planar conductors separated by a dielectric layer. The electrical interconnecting apparatus may be, for example, a printed circuit board, a semiconductor device package substrate, or an integrated circuit substrate. The method includes determining a target impedance for the power distribution system. The method then selects one or more decoupling component electrical characteristic (e.g. capacitive) values associated with the decoupling components to be used in the power distribution system. Upon determining the decoupling component values, the method determines the number of decoupling components for each value selected. The method preferably determines the numbers of the decoupling components to place in the power distribution system based upon the target impedance of the power distribution system and the respective equivalent series resistances of each of the decoupling components. Finally, the one or more decoupling components are placed in the power distribution system in response to the method determining the number of each of the one or more decoupling components to use.

In another embodiment, the method determines a number of decoupling components for a power distribution system for a given frequency for a target impedance. This embodiment of the method comprises measuring an equivalent series resistance of a plurality of decoupling components, according to the method described above. Each of the plurality of decoupling components is measured in turn until the entire plurality has been measured. The method selects a particular one of the decoupling components with a resonance frequency approximately equal to the given frequency. The method then compares the equivalent series resistance of the particular one of the decoupling components to the target impedance and determines the number (i.e. how many) of the particular one of the plurality of decoupling components to be used. The number of the particular one of the plurality of decoupling components has approximately equal value to the quotient obtained from dividing the equivalent series resistance of the particular one of the plurality of decoupling components by the target impedance for the power distribution system. The method places the number of the particular one of the plurality of decoupling components in the power distribution system in response to selecting the number of the particular one of the plurality of decoupling components.

In another embodiment, a frequency range replaces the given frequency. Rather than selecting one decoupling component to match the given frequency, a plurality of components is chosen to ensure that the power distribution system is at or below the target impedance over the frequency range. The method repeats with each additional particular one of the plurality of decoupling components being selected for an additional resonance frequency, so long as the additional resonance frequency is within the frequency range.

BRIEF DESCRIPTION OF THE DRAWINGS

Other objects and advantages of the invention will become apparent upon reading the following detailed description and upon reference to the accompanying drawings in which:

FIG. 6A is a diagram of an embodiment of a system for measuring the equivalent series resistance of one or more electrical devices, such as one or more capacitors;

FIG. 6B is a close-up view of an embodiment of connections that may be used with the system of FIG. 6A for measuring the equivalent series resistance of a plurality of electrical devices, such as a plurality of capacitors;

Figure 1:
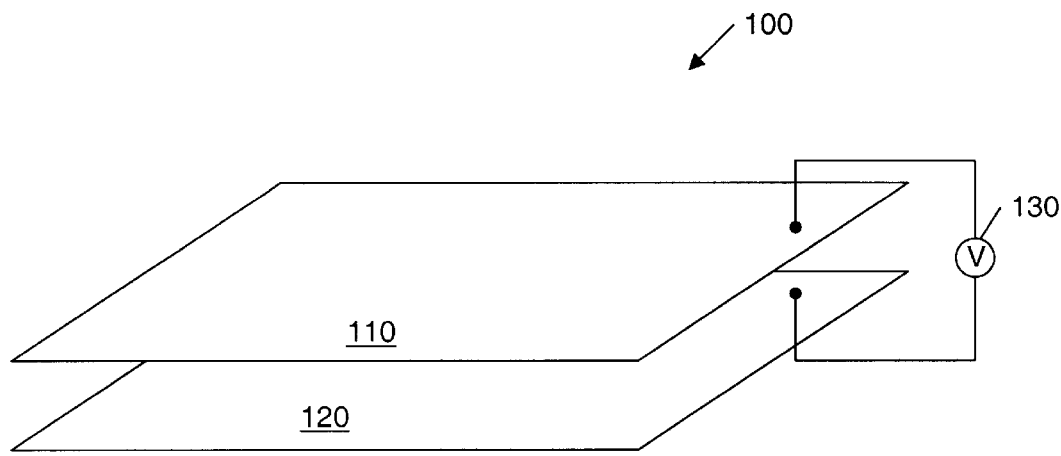
FIG. 1 is a perspective view of a representative electrical interconnecting apparatus comprising a prior art pair of 10 in.×10 in. square conductive planes separated by a fiberglass-epoxy composite dielectric layer.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 4A:
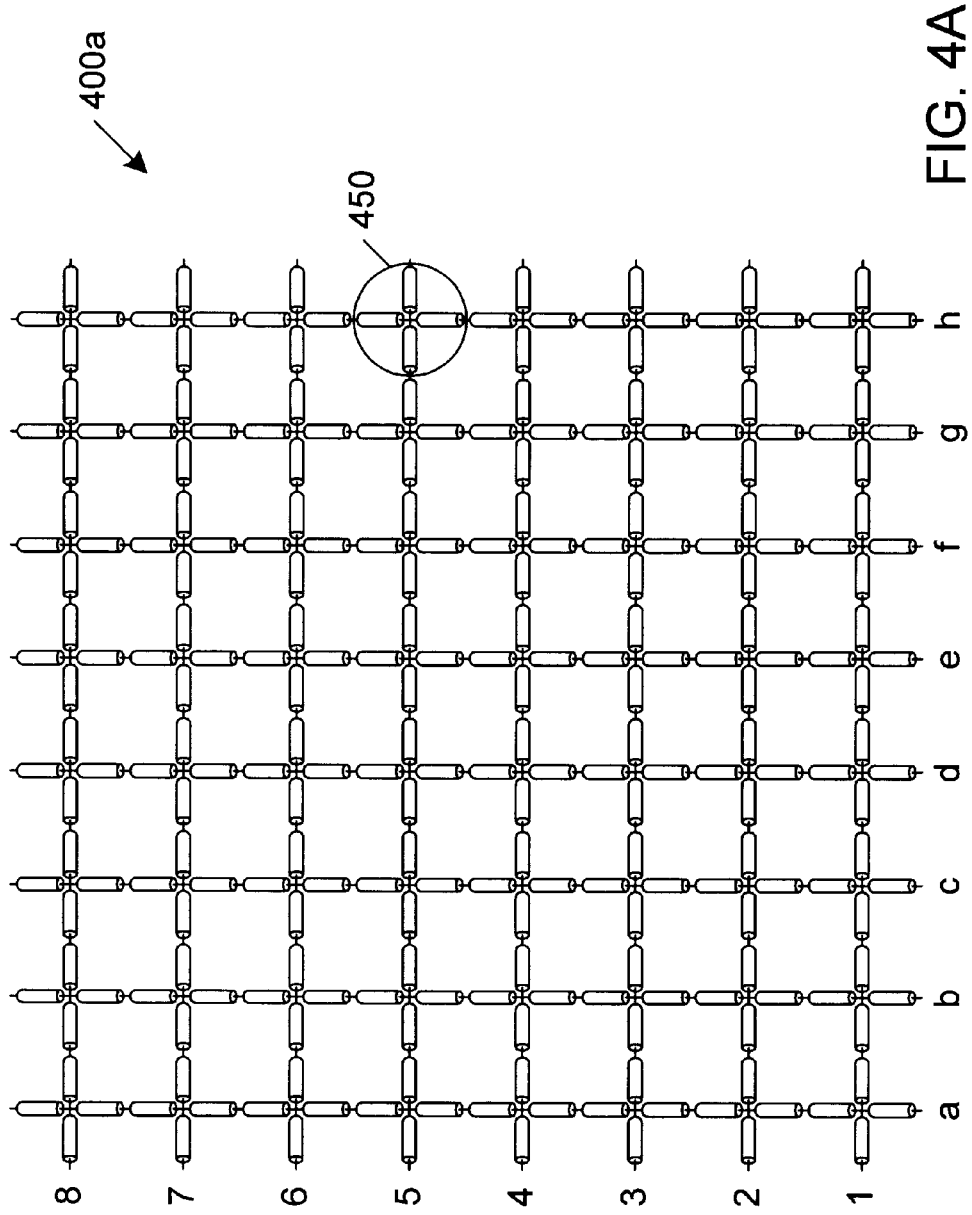
FIG. 4A is a top view of one embodiment of a model of a power distribution system.
Figure 4B:
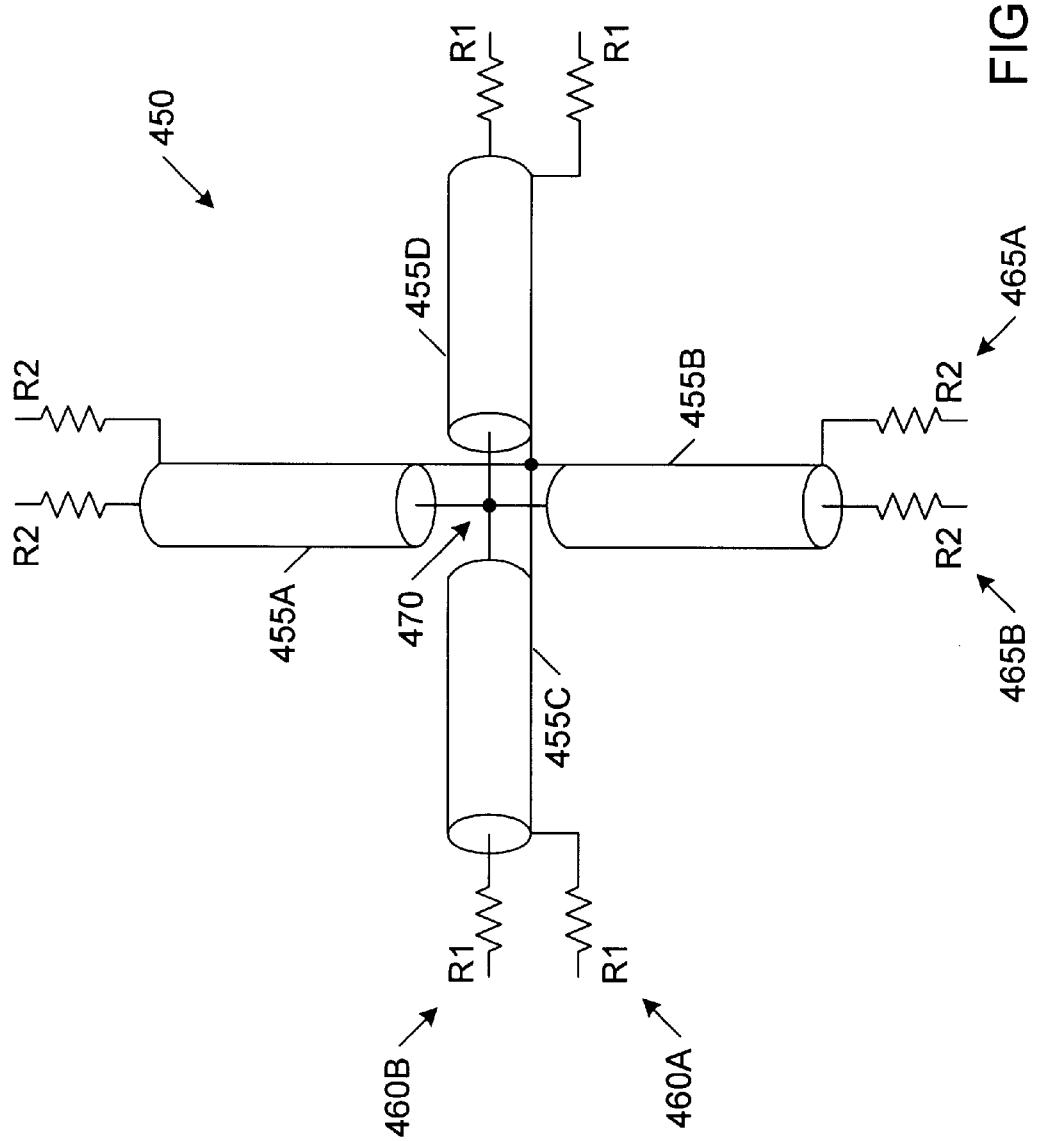
FIG. 4B is an embodiment of a unit cell of the power distribution system model shown in FIG. 4A.
Figure 4C:
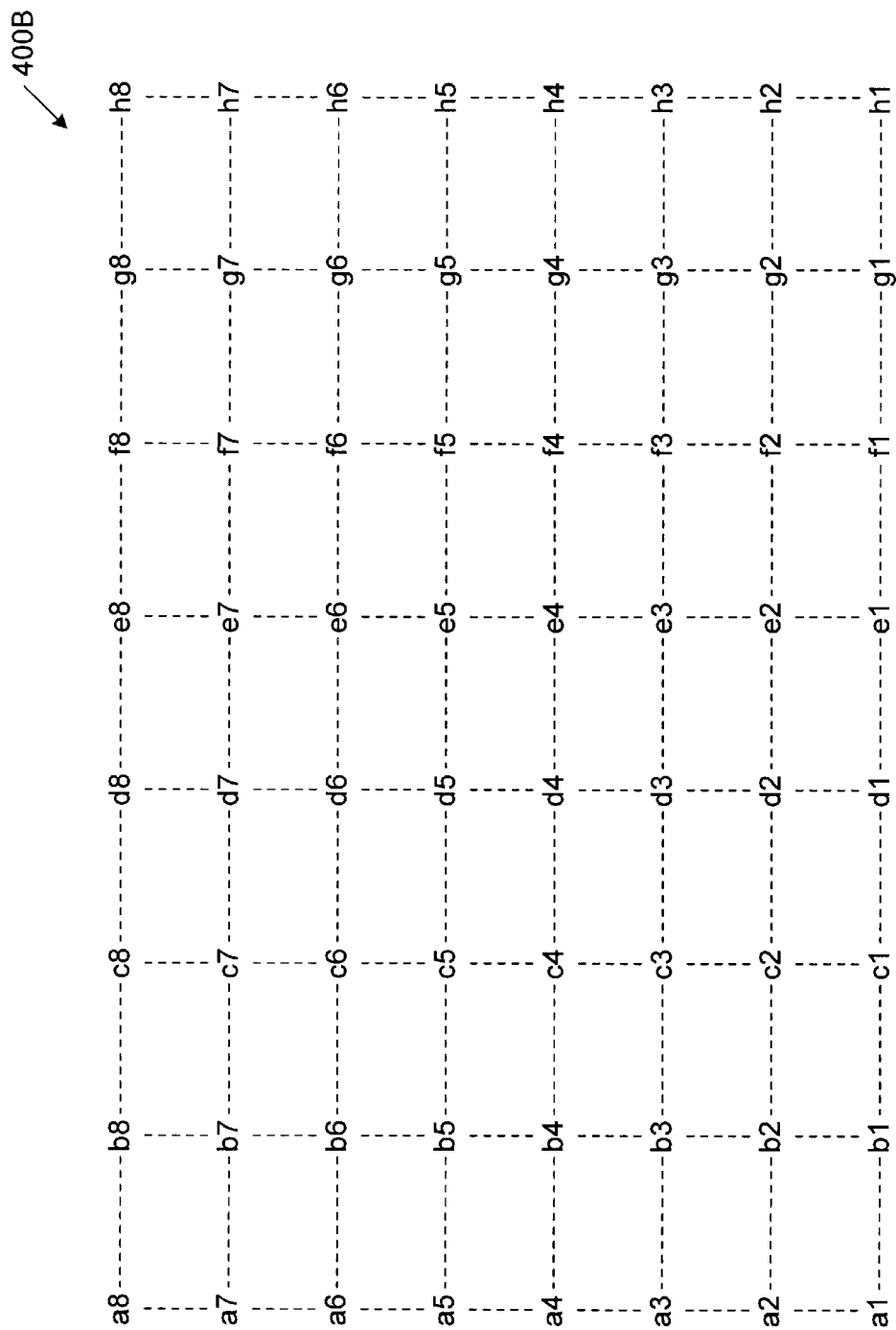
FIG. 4C is a representative grid of the nodal interconnections of the model of the power distribution system shown in FIG. 4A.

FIGS. 4A–4C—Power Distribution System Model and Grid

FIG. 4A is a top view of a simplified schematic of one embodiment of a model of a power distribution system. As shown, the model comprises a grid 400A of transmission line segments. The segments are grouped into unit cells 450. As shown, there are eight columns labeled "a" through "h", as well as eight rows labeled, from the bottom to the top, "1" through "8". The model preferably comprises a SPICE array of transmission lines in a fixed topology (i.e. in an 8×8 grid). The transmission lines are variable lengths such that the fixed topology may be used on electrical connecting device of any physical dimensions. It is noted that other embodiments of the power distribution system are contemplated, such as an elliptical model based on a "wheel and spoke" geometry.

FIG. 4B illustrates a close up view of the unit cell 450 from FIG. 4A. As shown, the unit cell 450 is comprised of four transmission lines 455A–455D. The four transmission lines 455 connect together at nodal point pair 470, also referred to as node 470. As shown, connections to the center conductors represent plane 1, while connections to shield are plane 2. Note that the model is balanced, therefore either plane 1 or plane 2 may be power or ground, as desired. Transmission lines 455A and 455B are preferably described with a width impedance "$Z_W$" and a width time delay "$t_{DW}$". Transmission lines 455C and 455D are preferably described with a length impedance "$Z_L$" and a length time delay "$t_{DL}$". $R_1$ and $R_2$ are resistances. The constants, parameters and variables of interest, as well as the equations that define and relate these quantities, along with the preferred units are given below:

"L" is the length of the plane (inches)
"W" is the width of the plane (inches)
"thk" is the thickness of the dielectric (mils)
"cu" is the metalization thickness (mils)
"velc" is the speed of light in a vacuum (inches/sec)
"hertz" is the frequency variable "$\epsilon_0$" is the vacuum dielectric constant (permittivity) (picofarads/inch)
"$\epsilon_r$" is the dielectric constant
"$\sigma$" is the copper conductivity (per ohm/mils)
"$\mu_0$" is the permeability of a vacuum (henries/mil)
"vel" is the velocity of a signal on the electrical interconnecting apparatus $$vel = velc/\sqrt{\epsilon_r}$$

"n" is the size of the grid, i.e. 8 as shown
"asp" is the aspect ratio of the grid, asp=L/W
"factor" is a calibration factor to compensate for capacitive loading $$factor = 1\sqrt{2}$$

"$t_{FL}$" is the time of flight for the length dimension, $t_{FL}$=L/vel
"$t_{FW}$" is the time of flight for the width dimension, $t_{FW}$=W/vel
"$t_{DL}$" is the transmission line delay time for the length dimension $$t_{DL} = t_{FL}/(2n)\text{factor}$$

"$t_{DW}$" is the transmission line delay time for the width dimension $$t_{DW} = t^{FW}/(2n)\text{factor}$$

"cap" is the parallel plate capacitance of the plane $$cap = (\epsilon_0 \epsilon_r LW)/(10^{-9}\text{thk})$$

"$Z_L$" is the impedance in the length direction $$Z_L = (n/cap)(t_{FL} + asp \cdot t_{FW})\text{factor}$$

"$Z_W$" is the impedance in the width direction, $Z_W = Z_L/asp$
"$R_1$" is the smaller of:

$$R_{1A} = ((L/W)/2) \cdot (1/(\sigma \cdot (1/\sqrt{hertz \cdot \pi \mu_0 \sigma})))$$

$$R_{1B} = ((L/W)/2) \cdot (1/(\sigma \cdot cu))$$

"$R_2$" is the smaller of:

$$R_{2A} = ((W/L)/2) \cdot (1/(\sigma \cdot (1/\sqrt{hertz \cdot \pi \mu_0 \sigma})))$$

$$R_{2B} = ((W/L)/2) \cdot (1/(\sigma \cdot cu))$$

The model represents an electrical interconnecting apparatus, which may be, for example, a printed circuit board (PCB), a semiconductor device package substrate, or an integrated circuit substrate. The present method includes creating a model of the power distribution system based upon an M×N grid for both the power plane and the ground plane. The model is preferably based upon a fixed grid that adapts automatically to the actual physical dimensions of the electrical interconnecting apparatus. The model preferably also calculates the system response to chosen decoupling components in both single node and M×N node versions.

The model receives input from a user and from a database of various physical and/or electrical characteristics for a plurality of decoupling components. Various characteristics of interest include physical dimensions, type and thickness of dielectric, method and materials of manufacture, capacitance, mounted inductance, and equivalent series resistance (ESR). The desired characteristics are preferably saved in a database for corrections, additions, deletions, and updates.

In one embodiment, the model of the power distribution system is in a form of a plane including two-dimensional distributed transmission lines. The model of the power distribution system may comprise a plurality of the following: one or more physical dimensions of the power plane, one or more physical dimensions of the ground plane, physical separation distance of the power plane and the ground plane, composition of a dielectric separating the power plane and the ground plane, one or more active device characteristics, one or more power supply characteristics, and one or more of the decoupling components. In a preferred embodiment, M and N have a uniform value, 8 as shown. In various embodiments, the active components act as current sources or sinks, and may include processors, memories, application specific integrated circuits (ASICs), or logic ICs. Preferably, a total sum of all values of the current sources in the model is scaled to equal one ampere.

In one embodiment, the model of the power distribution system is operable for determining the decoupling components for a frequency range above approximately a lowest board resonance frequency. Additional information on board resonance frequencies is found later with respect to FIG. 5. In another embodiment, the model of the power distribution system is operable for determining the decoupling components for a frequency range above a highest resonance frequency from all resonance frequencies of the decoupling components.

In one embodiment, the model uses a weighting factor in determining a number of a particular decoupling component to include in the model. The weighting factor is a dimensionless non-zero positive number. In the frequency range where EMI is most important, the preferred weighting factor is 0.2. The EMI frequency range is preferably above approximately 200 MHz. Preferably, the weighting factor is 1.0 in a frequency range where signal integrity is most important. The frequency range where signal integrity is important is preferably approximately 10 MHz up to approximately 200–300 MHz. The weighting factor is preferably 2.0 at all active device operating frequencies and harmonics of the active device operating frequencies. In a preferred embodiment, the model includes a frequency dependent skin effect loss.

FIG. 4C illustrates the 8×8 grid 400B of nodes 470 that are used to model the power and ground planes with the respective designations of a1 through h8, in a preferred embodiment. This grid 400B is used to determine the locations of the decoupling components for the power distribution system.

Figure 5:
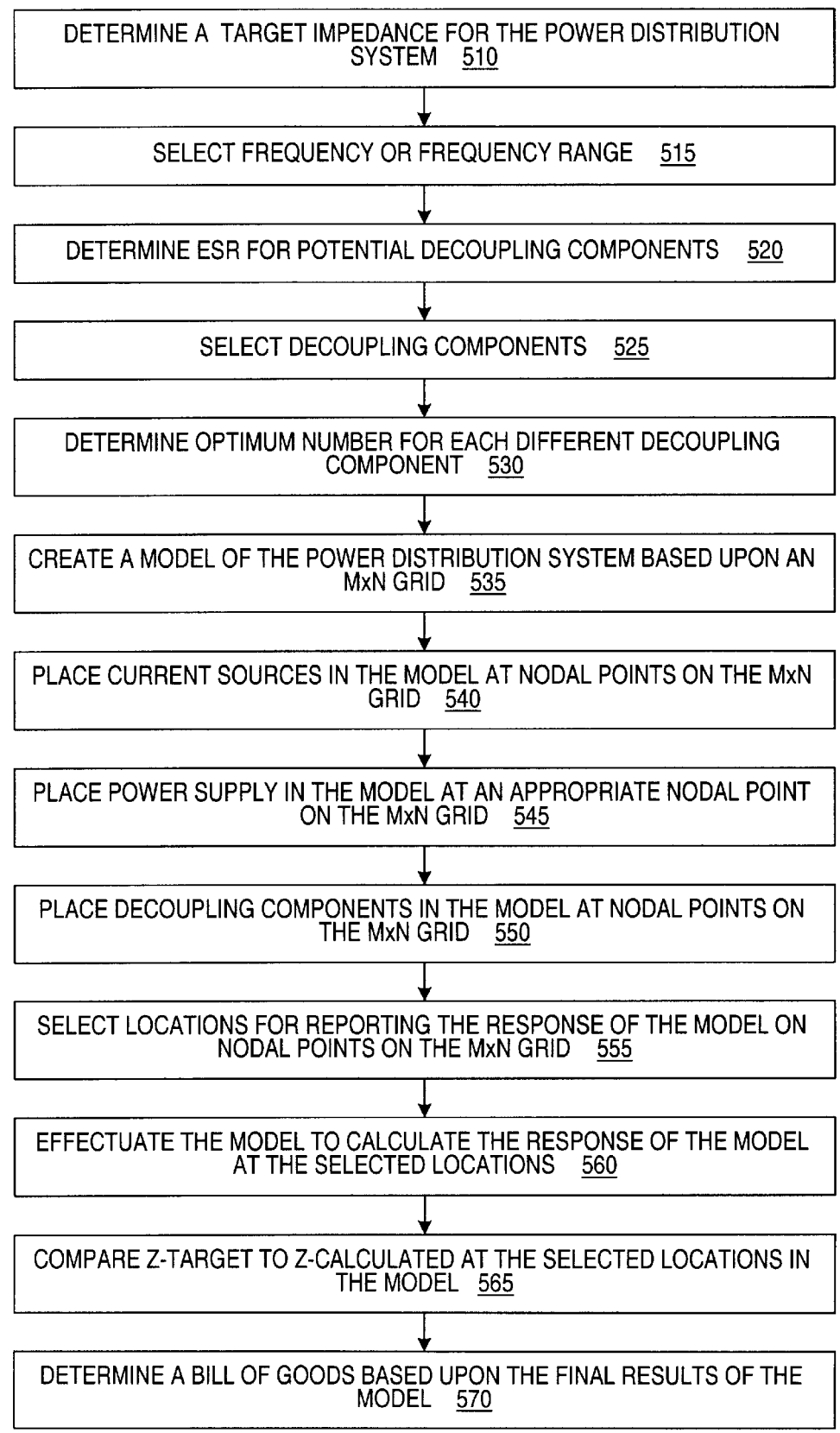
FIG. 5 is a flowchart of an embodiment of a method for determining decoupling components for a power distribution system.

FIG. 5—Method for Determining Decoupling Components

FIG. 5 illustrates a flowchart of an embodiment of a method for determining decoupling components for a power distribution system. The method is shown as a straight through method with no loop-back. In other embodiments, the method includes feedback loops at various stages to change previous inputs.

The method determines a target impedance for the power distribution system 510. The target impedance is preferably determined at a desired frequency or over a desired frequency range. The target impedance is determined based upon such factors as power supply voltage, total current consumption, and allowable voltage ripple in the power distribution system. Preferably, determining the target impedance for the power distribution system comprises the quotient of power supply voltage multiplied by allowable voltage ripple divided by total current. In a preferred embodiment, the total current is normalized to one ampere. The target impedance may be comprised in a group of known system parameters. Other known system parameters may include one or more power supply characteristics, the allowable voltage ripple, the total current consumption of all devices, one or more physical dimensions of the power distribution system, physical location constraints on where devices may be placed in the power distribution system, and/or a frequency or frequency range of interest.

The method preferably selects a frequency range of interest 515. The frequency range may start at dc and rise up to or above the gigahertz range. In one embodiment, the model of the power distribution system is operable for determining the decoupling components for a frequency range above approximately a lowest board resonance frequency. In another embodiment, the model of the power distribution system is operable for determining the decoupling components for a frequency range above a highest resonance frequency from all resonance frequencies of the decoupling components. As mentioned above, the frequency range of interest may be comprised in the known system parameters. In one embodiment, the frequency range of interest determines the output of the method by limiting the frequency range over which the system impedance is calculated in the model.

The method preferably determines the ESR for the plurality of decoupling components 520. The decoupling components are preferably capacitors, but other devices with desirable electrical characteristic values may be used. The ESR is preferably included in the database of various physical and/or electrical characteristics for the plurality of decoupling components. Various other characteristics of interest may include physical dimensions, type and thickness of dielectric, method and materials of manufacture, capacitance, and mounted inductance. The desired characteristics are preferably saved in the database for corrections, additions, deletions, and updates. Additional details concerning determining the ESR for the plurality of decoupling components 520 is given below with respect to FIG. 6.

The method preferably selects one or more desirable decoupling components from a plurality of possible decoupling components 525, preferably by value of one or more associated electrical characteristics. Preferably, the decoupling components are capacitors with an approximate mounted inductance and an ESR. In one embodiment, a range of the values of the capacitors is chosen such that a superposition of impedance profiles provide an impedance at or below the target impedance for the power distribution system over the frequency range of interest. In another embodiment, the impedance profiles of the plurality of possible decoupling components are compared to resonance frequencies for the power distribution system.

The decoupling components have resonance frequencies, which should substantially correspond to the resonance frequencies of the power distribution system in the frequency range of interest. Resonance frequencies for the decoupling components are preferably chosen to approximately correspond to board resonance frequencies, operating frequencies and harmonics of active devices, including power supply, on the electrical interconnecting apparatus, and interaction resonance frequencies, high frequency response frequencies from interactions of the various components in the power distribution system. In various embodiments, the capacitors are selected by the type of manufacture, such as the dielectric composition, or a physical or electrical characteristic value, such as the mounted inductance. The mounted inductance includes the geometry and physical coupling to the electrical interconnecting apparatus. The resonance frequency for a capacitor may be calculated from the mounted inductance and the capacitance using the following formula:

$$f_{resonance}=1/(2\pi\sqrt{LC})$$

The magnitude of the impedance of the capacitor at the resonance frequency is the ESR. It is noted that ceramic capacitors often have a deep cusp at the resonance frequency. Tantalum capacitors often have a deep broad bottom with a variable slope as a function of frequency.

Once the specific values for the desired electrical characteristic(s) associated with the decoupling components have been selected, the optimum or desired number of each of the particular ones of the decoupling components is determined by the method 530. In one embodiment, the number of each of the particular ones of the decoupling components are determined by the method 530 in response to the method selecting one or more desirable decoupling components from a plurality of possible decoupling components 525.

The method, therefore, preferably determines a number (i.e. a counting number, 1, 2, . . . ) for each of the one or more decoupling components chosen to be included as part of the power distribution model 530. In other words, the method determines how many of each particular decoupling component to include in the model. In one embodiment, the number of the various decoupling components is chosen based upon the frequency range of interest and the impedance profiles of the plurality of possible decoupling components. In another embodiment, the number of decoupling components of each specific value is determined by choosing the smallest integer number of decoupling components which, when coupled in parallel, results in an impedance which is closest to but not greater than the target impedance. In another embodiment, the number of decoupling components of each specific value is determined by choosing the smallest integer number with a value closest to, but not less than, the quotient obtained from dividing the ESR of the particular decoupling component by the target impedance for the power distribution system.

In still another embodiment, the number of a particular decoupling components has approximately equal value of impedance to the target impedance for the power distribution system when the number of the particular decoupling components are placed in parallel. In one embodiment, determining the number for the each of the decoupling components 530 occurs before effectuating the model of the power distribution system to determine the transfer impedance values as the function of frequency at the one or more specific locations 560. In another embodiment, the number of a particular one of the one or more decoupling components has approximately equal value of a next larger integer of the quotient obtained from dividing an equivalent series resistance for the particular one of the one or more decoupling components by the target impedance for the power distribution system. In still another embodiment, the number of decoupling components is determined for all decoupling components 530 in the plurality of possible decoupling components (i.e. in the database described above) before selecting the decoupling components to be used in the model 525. The calculations for selecting decoupling components 525 and determining the number of each of the selected decoupling components 530 are preferably performed by a computer system. Additional details may be gleaned below with respect to FIGS. 7–9.

The method creates (i.e. realizes or implements) the model of the power distribution in 535. In a preferred embodiment, the model is computerized. Additional details may be found elsewhere in this disclosure.

The method next populates the model of the power distribution system. That is, the method adds to the model those devices that are coupled to the electrical interconnecting apparatus. The method places current sources (or sinks) in the model at nodal points 470 on the M×N grid 400B in 540. The current sources are placed at one or more spatial locations corresponding to one or more locations of active components. Examples of active components include processors, memories, application specific integrated circuits (ASICs), or logic integrated circuits (logic ICs). It is noted that active devices may act as current sources or sinks. The total value of the current sources is preferably scaled to one ampere. The numbers, current ratings and strengths, and locations of the current sources may be included in the known system parameters. In one embodiment, the placing of the current sources is performed by the computer system based on the known system parameters.

Optionally, the method places one or more power supplies in the model placed at nodal points 470 representing one or more spatial locations on the electrical interconnecting apparatus 545. The power supply is comprised in the model as one or more pole frequencies, one or more zero frequencies, and one or more resistances. Preferably, one pole frequency, one zero frequency, and two resistances are used, along with the output voltage. Typically, the parameters are treated as a series with one resistance in parallel with the zero frequency. The parameters and locations of any power supplies are usually part of the known system parameters. In one embodiment, placing the power supply in the model is performed by the computer system. Additional details may be found with respect to FIGS. 8A–8B and 9.

The method also preferably places the decoupling components in the model of the power distribution system at nodal points 470 that couple the M×N grid 400 for the power plane and the corresponding M×N grid for the ground plane 550. Particular decoupling components should optimally be placed as close as possible to those device locations which have resonance frequencies in the frequency range of interest. Resonance frequencies for the power distribution system should be interpreted in this disclosure to include board resonance frequencies, operating frequencies and harmonics of active devices on the electrical interconnecting apparatus, and high frequency response frequencies from interactions of the various components in the power distribution system. High frequency response is often highly spatially dependent.

Board resonance frequencies are a function of the physical dimensions of the power distribution system and the dielectric constant of the dielectric that separates the power plane from the one or more ground planes. The board resonance frequencies of interest in a preferred embodiment include the half-, full-, three-half-, second-full-, and five-half-wave resonance frequencies for both the length and the width. The values for these board resonance frequencies are given by the appropriate multiples of vel, L, and W as defined earlier. For example, the half wave resonance for the length is (½)*vel*L. The three-half wave resonance for the width is (3⁄2)*vel*W.

To suppress the board resonance frequencies, decoupling components are placed in the power distribution system at locations that provide a low impedance shunt for high impedance resonance nodes (i.e. high voltage standing wave points). By noting where the board resonance has one or more maximums, the placement follows at or near those corresponding locations. For a half wave resonance, the decoupling components should be placed along the edges of the power distribution system or the electrical connecting apparatus. Since the apparatus is not one dimensional, the decoupling components are placed on the line resulting from the intersection of the resonance and the plane defining the power distribution system. Therefore, the decoupling components for the length half-wave resonance are preferably placed along the edges on the width of the power distribution system. For the full wave resonance, the decoupling components are preferably placed along the edges and along the center axis of the power distribution system. For the three-half-wave resonance, the decoupling components are preferably placed along the edges and at points one-third in from each edge. For the second-full-wave resonance, the decoupling components are preferably placed along the edges, along the center axis, and at points one-fourth in from each edge. For the five-half-wave resonance, the decoupling components are placed along the edges, at points one-fifth in from each edge, and at points two-fifths in from each edge. It is noted that a square electrical connecting apparatus the lengthwise and widthwise resonances will be at the same frequencies and have maximums at corresponding locations. It is also noted that similar relations are found with respect to an electrical connecting apparatus having a different geometry, such as elliptical, etc.

Resonance or operating frequencies for the power supply are usually low enough that the capacitance can be treated as a lumped capacitance. Thus decoupling components for the power supply may be placed anywhere on the electrical interconnecting apparatus. Spatial limitations on locations must always be observed. This means that some decoupling components will be placed farther away from the noise source than optimum. The model will often indicate that additional ones of those decoupling components will need to be placed on the electrical interconnecting apparatus at the farther away location. In one embodiment, placement of decoupling components 550 is input to the computerized model. Additional details may be found in the descriptions of FIGS. 8A–8B and 9.

The method preferably selects one or more specific locations in the model of the power distribution system to calculate transfer impedance values 555 as a function of frequency. The specific locations preferably include all 64 nodes on the 8×8 grid. To shorten execution time of the computer system, other numbers of nodes may be chosen. It is noted that as the number of nodes increases, the model will accurately predict the board resonance frequencies up to higher frequencies. In one embodiment, the model is run twice, once with a single specific node with all components placed on the single specific node and then a second time with the power distribution system filling the entire 64 nodes of the model. The specific locations are usually part of the known system parameters. It is noted that if fewer numbers of nodes are chosen, the usable bandwidth of the model will be lower.

The method preferably effectuates the model of the power distribution system to determine the transfer impedance values as the function of frequency at the one or more specific locations previously chosen 560. In one embodiment, the model is effectuated by running computer programs on the computer system. Additional details may be found in the description of FIGS. 8A–8B and 9.

The method then preferably compares the transfer impedance values as the function of frequency at the one or more specific locations to the target impedance for the power distribution system 565. In one embodiment, one or more graphs are output which illustrates the transfer impedance values as a function of frequency. Preferably, the graphs are computer generated. In another embodiment, the method outputs a resultant noise level for the power distribution system due to the current sources and the decoupling components at the specific locations. In still another embodiment, the method outputs the plurality of resultant impedances at the plurality of specific locations in the power distribution system dynamically as a function of frequency.

Preferably, the method determines at least a portion of a "bill of goods" for the power distribution system based upon the results of effectuating the model 570. The bill of goods lists all relevant information from the selecting and placing of the various decoupling components. The bill of goods is preferably sufficient to allow mass production of the electrical interconnecting apparatus modeled to occur with proper decoupling of the final product. Although the method is shown in flowchart form, it is noted that portions of FIG. 5 may occur concurrently or in different orders.

FIGS. 6A–6D—System and Method for Measuring ESR

FIG. 6A illustrates an embodiment of a system 600 for measuring the ESR of one or more decoupling components, or capacitors. The system 600 preferably comprises the HP 4291A mainframe 310 connected to the test station 320. Note that support 324 is unused in this embodiment. A test head with an APC-7 connector 325 at an input/output port attaches to the test station 320. The connector assembly, as shown, includes a first connector 630 mating to the APC-7 connector 325 and converting the output for N male coupling; an N male to SMA male adaptor 640 connects to the first connector 630; and an SMA female bulkhead connector 650 connects to the adaptor 640. The DUT, capacitor 360, is connected to a terminal portion of the bulkhead adaptor 650 with a conductive adhesive. It is noted that compensation for OPEN/SHORT or electrical length may be unnecessary.

In a preferred embodiment, the connector assembly comprises the following connectors and adapters. The first connector 630 is bundled with the HP 4291A mainframe 310 and test station 320. The SMA male to N male adaptor 640 is preferably model PE9080 available from PASTERNACK ENTERPRISES, P.O. Box 16759, Irvine, Calif. 92623-6759, 714-261-1920. The SMA female bulkhead connector 650 is preferably model PE4525. In one embodiment, one or more outer legs 651A are removed from the SMA female bulkhead connector 650. In another preferred embodiment, the SMA male to N male connector 630 is replaced with model PE9081 SMA female to N male connector and PE 9069 feed through SMA male to male connector, all available from PASTERNACK ENTERPRISES. For the purposes of this disclosure, the "connector assembly" may be a single connector unit, or it may comprise a plurality of connector units and/or adaptor units.

In other embodiments, the impedance analyzer 310 comprises a computer or computer system connected to an impedance measuring device. It is contemplated that a general-purpose computer could be connected to a specialized impedance measuring component to replace the HP 4291A mainframe 310 and test station 320. This would allow for storage and manipulation of data in the database disclosed elsewhere.

The capacitor 360 as shown is connected to the second connector 650 of the connector assembly with an electrically and mechanically stable connection, using conductive adhesive 670A and 670B to connect the leads 361A and 361B to respective legs 651A and 651B of the terminal portion of SMA female bulkhead connector 650. The conductive adhesive is contemplated as solder or other means of semi-permanently connecting the capacitor 360 to the second connector 650. It is contemplated that soldering is heat activated or cold solder. Cold solder is preferably a metal-containing adhesive, such as epoxy, which may be chemically activated. Any composition of "hot" solder is acceptable for this disclosure including alternative to lead (Pb) solders. Examples of cold solders that may be suitable include POLY-SOLDER LT available from Alpha Metals, Inc., 600 RTE 440, Jersey City, N.J. 07304, 201-434-6778; NORCAST 4913 available from norlabs incorporated, 565 Eagle Rock Avenue, Roseland, N.J. 07068, 973-403-2600; and CARDIOSENS/K available from Burdick Inc., a division of Spacelabs Medical, Inc., 15220 N.E. 40th Street, P.O. Box 97013, Redmond, Wash. 98073-9713, 425-882-3700. Removable, conductive putty is also contemplated, as is conductive adhesive tape.

FIG. 6B illustrates an embodiment of the second connector 650 of the connector assembly and the DUT, which includes a plurality of capacitors 360A, 360B, and 360C. In this embodiment, the first leg 361A of the first capacitor 360A is connected to the outer leg 651A of the second connector 650 using the conductive adhesive 670. The other leg 361B of the first capacitor 360A is connected to the first leg 361C of the second capacitor 360B using the conductive adhesive 670. The other leg 361D of the second capacitor 360B is connected to the first leg 361E of the third capacitor 360C using the conductive adhesive 670. The other leg 361F of the third capacitor 360C is connected to the center leg 651B of the second connector 650.

Figure 6C:
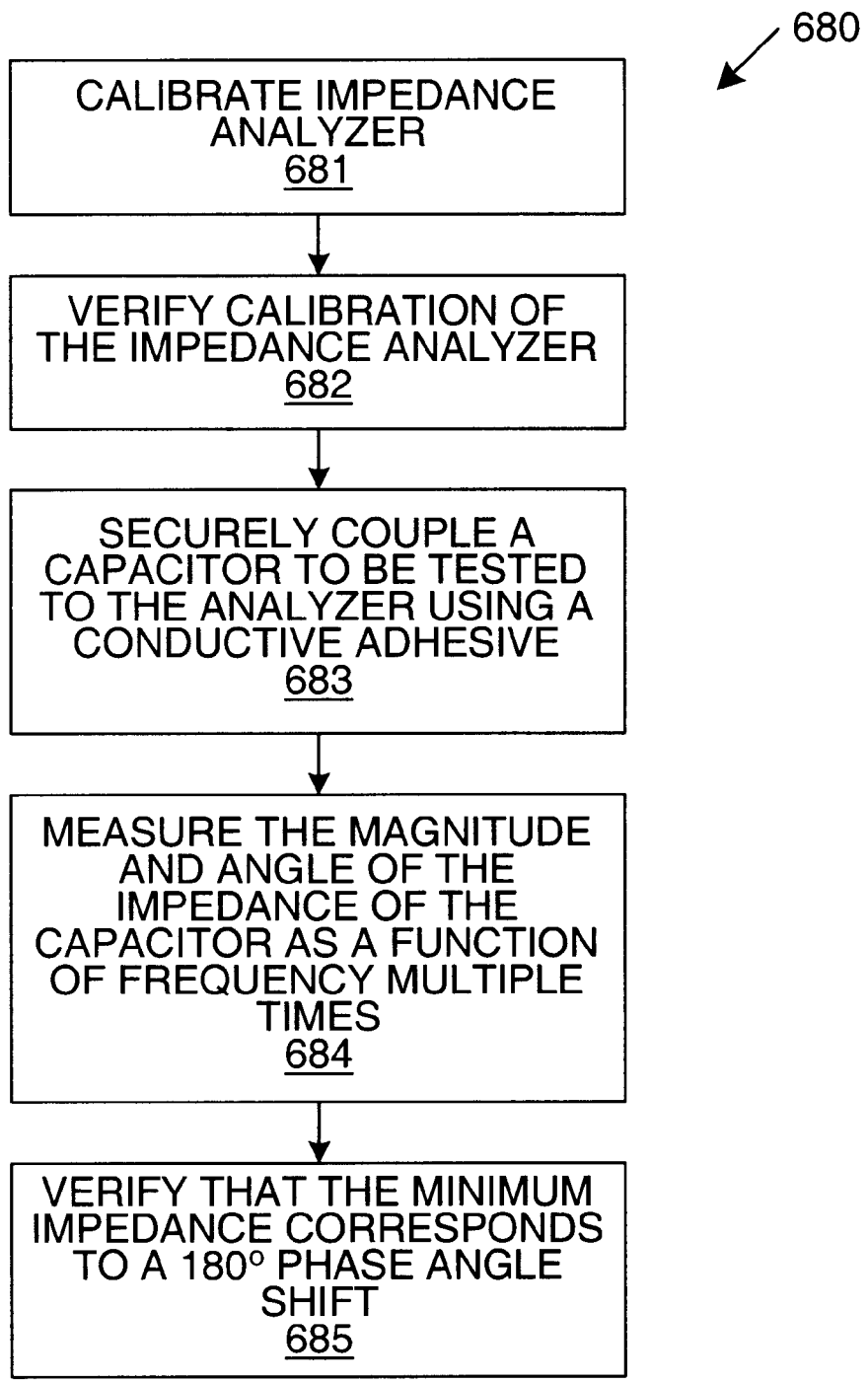
FIG. 6C is a flowchart of an embodiment of a method for measuring the equivalent series resistance of an electrical device, such as a capacitor.

FIG. 6C illustrates a flowchart of an embodiment of a method 680 for measuring the ESR of a capacitor. The method 680 is a preferred embodiment for 520, referenced above. In a preferred embodiment, the system of FIGS. 6A/6B is used, although the use of other systems is also contemplated. The method comprises calibrating an impedance analyzer 681. Calibrating preferably comprises connecting the test head and the connector assembly, except the last one connected to the capacitor, to the impedance analyzer prior to all other work. Calibrating preferably involves three test cases using a 50 Ω load, a short, and an open circuit. In one embodiment, all portions of the connector assembly are connected to the impedance analyzer prior to or as part of the calibration 681.

The method verifies 682 the calibration performed in 681 before mounting the capacitor. Verification preferably comprises comparing the expected smith chart reflection coefficient for each test case with the experimentally determined reflection coefficient. After the impedance test passes the calibration, the capacitor is securely connected to the impedance analyzer using a conductive adhesive 683. Preferably, securely connecting the capacitor to the analyzer comprises capacitor 360 being connected to the connector assembly 650 with an electrically and mechanically stable connection, using conductive adhesive 670A and 670B to connect the leads 361A and 361B to respective legs 651A and 651B of the SMA female bulkhead connector 650, as shown in FIG. 6A. The connector assembly is then connected to the input/output port of the impedance analyzer.

The method measures the impedance of the capacitor as a function of frequency over the desired frequency range 684. In a preferred embodiment, both the magnitude and the phase angle of the impedance are measured. Preferably, the measurement is repeated multiple times and the results averaged. The method then verifies the results of the measurements 685. Preferably, verification comprises comparing 180° to the phase angle shift at the frequency at which the capacitor has a minimum measured impedance value. If the phase shift at the frequency at which the capacitor has a minimum measured impedance value is not 180° at an acceptable uncertainty, then the results are discarded and the method performed anew. If the phase shift at the frequency at which the capacitor has a minimum measured impedance value is 180° at an acceptable uncertainty, the amplitude of the minimum measured impedance is the ESR of the capacitor. The baseline value for the 180° phase shift changes for each capacitor, but is relatively constant for a set of measurements on each capacitor. Although the method is shown in flowchart form, it is noted that portions of FIG. 6C may occur concurrently or in different orders.

In a preferred embodiment, measuring the impedance as a function of frequency using the HP 4291A is comprised as follows. Set the MAG ($|Z|$) and ($\theta_Z$) from "Meas" under the dual parameter key on the HP 4291A. Choose frequency range from 1 MHz to 1.8 GHz under the sweep button menu. Choose sweep type as logarithmic. Choose Marker search under search button and set it to minimum. Set marker search to on. Click on "Bw/Avg" menu under measurement block. Choose Sweep average and set average factor to 20. Hit sweep average start button to start taking measurements as a function of frequency. Note the minimum value after the averaging counter reaches 20. Repeat steps for each capacitor.

Figure 6D:
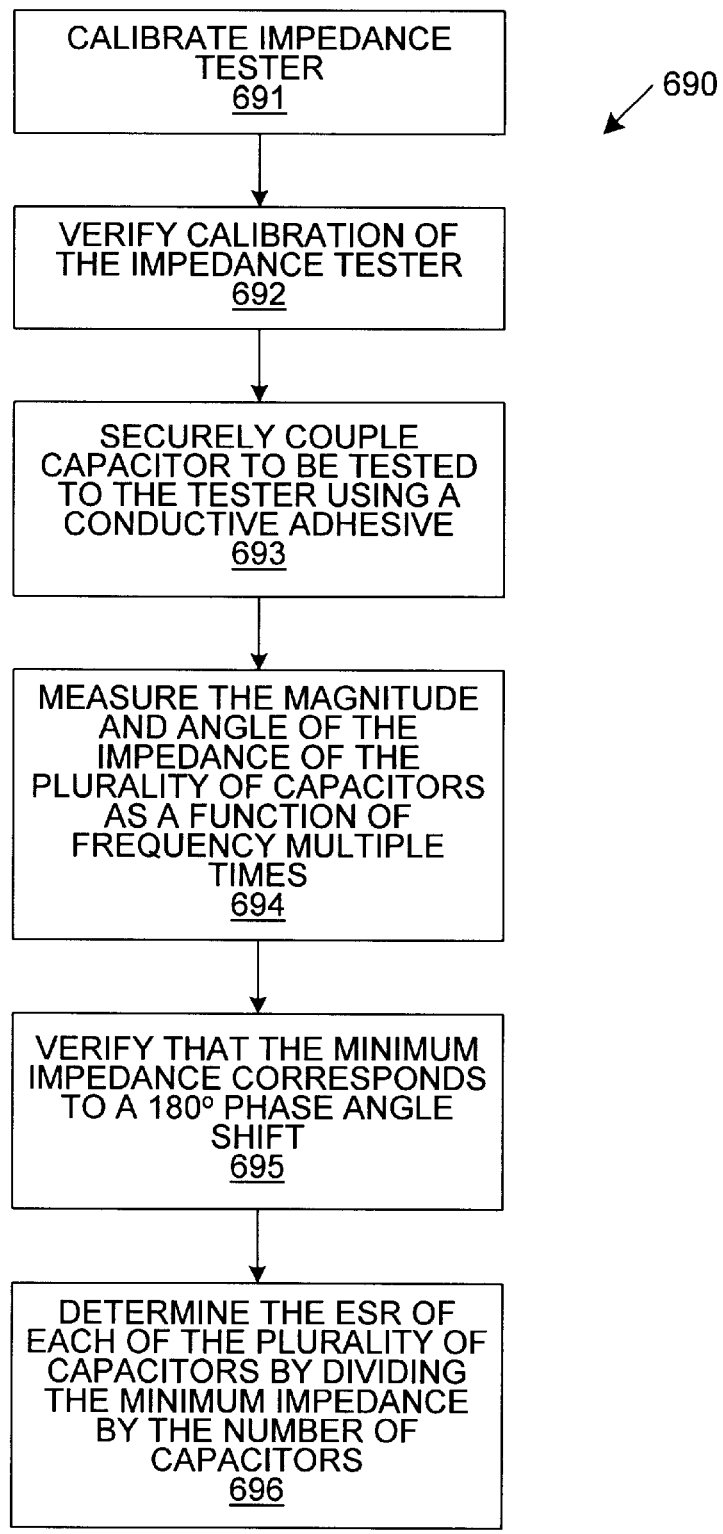
FIG. 6D is a flowchart of an embodiment of a method for measuring the equivalent series resistance of a plurality of electrical devices, such as a plurality of capacitors.

FIG. 6D illustrates a flowchart of an embodiment of a method for measuring the ESR of a plurality of capacitors. The method of FIG. 6D is similar in most respects to the method of FIG. 6C. Primary differences between the two methods are presented here. After the impedance test passes the calibration, the plurality of capacitors to be measured are securely connected in series to the impedance analyzer using a conductive adhesive 693. Preferably, securely connecting the plurality of capacitors to the analyzer comprises the first lead of the first capacitor being connected to the outer leg of SMA bulkhead connector 650 using the conductive adhesive. The other lead of the first capacitor is connected to the first lead of the next capacitor using the conductive adhesive. The second and successive first leads of the successive capacitors are connected using the conductive adhesive until the second lead of the last capacitor is connected to the other leg of the SMA bulkhead connector 650 using the conductive adhesive. All capacitor connections preferably use the conductive adhesive, such as solder, as disclosed above.

The method measures the impedance of the plurality of capacitors as a function of frequency over the desired frequency range 694. If the phase shift at the frequency at which the plurality of capacitors has a minimum measured impedance value is 180° at an acceptable uncertainty, the amplitude of the minimum measured impedance is the ESR of the plurality of capacitors 695. The ESR of each of the capacitors is determined by dividing the ESR of the plurality of capacitors by the number of capacitors 696. Although the method is shown in flowchart form, it is noted that portions of FIG. 6D may occur concurrently or in different orders. Additional details concerning FIG. 6 may be found by referring to other portions of this disclosure.

Figure 7:
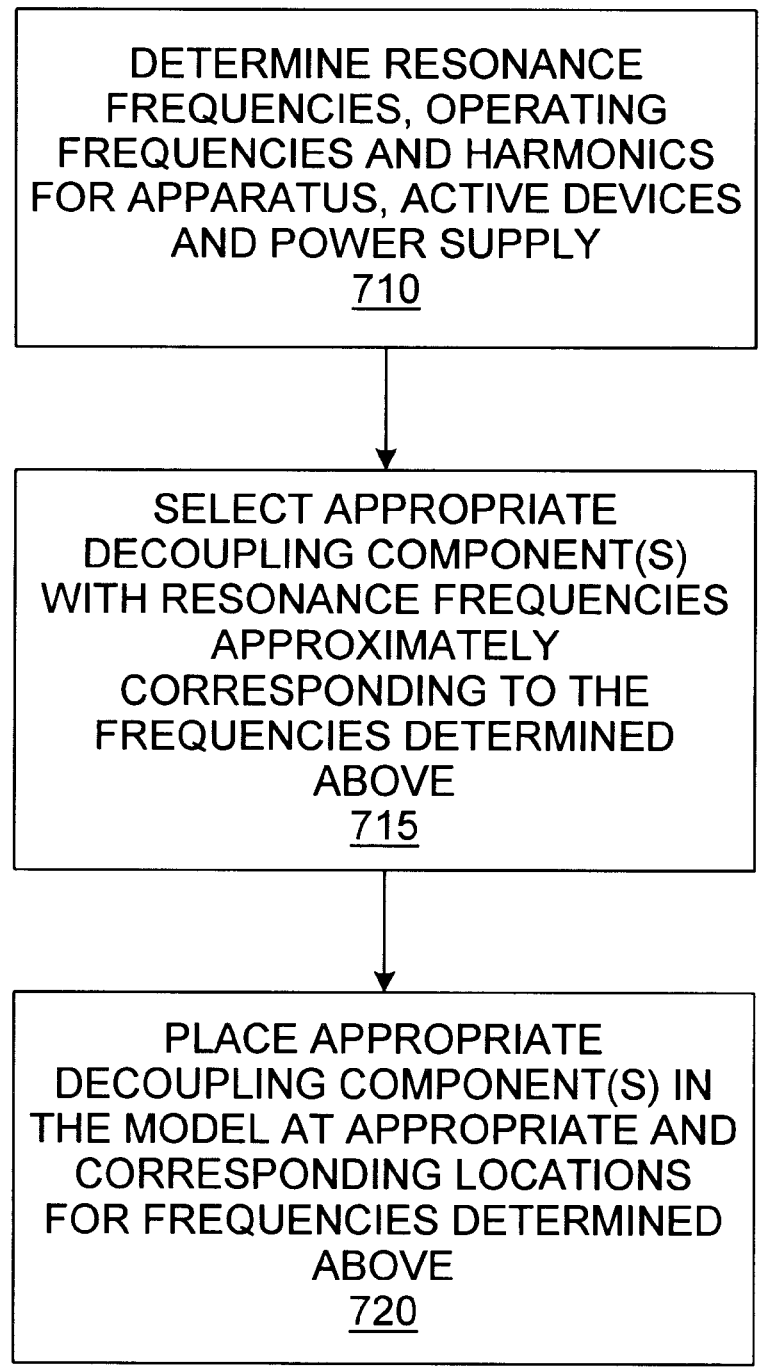
FIG. 7 is a flowchart of an embodiment of a method for placing decoupling components in a power distribution system.

FIG. 7—Method for Selecting and Placing Decoupling Components

FIG. 7 illustrates a flowchart of an embodiment of a method for selecting decoupling components and placing the decoupling components in a power distribution system. The method first determines resonance frequencies for the electrical interconnection apparatus, the active devices, and the power supply 710. Note that "resonance frequency" includes the operating frequencies and harmonics of the active devices and the power supply. Integer fractions of these frequencies may also be considered as resonance frequencies. The resonance frequencies of the electrical interconnection apparatus are also described as board resonance frequencies or board frequencies. The method then selects appropriate decoupling components 715. Appropriate decoupling components have approximately corresponding resonance frequencies to the system resonance frequencies determined in 710. The method next places the appropriate decoupling components in the model at appropriate and corresponding locations for the system resonance frequencies 720. After the model calculations are completed, the appropriate decoupling components will be placed on the electrical interconnection apparatus.

In various embodiments, the electrical interconnection apparatus may have one or more board resonance frequencies, with each of the board resonance frequencies corresponding to one or more particular dimensions of the electrical interconnection apparatus. Placement of a decoupling component 720 corresponding to a particular board resonance frequency is preferably at a location corresponding to the particular dimension in question.

In one embodiment, the method selects values for first decoupling components corresponding to the board resonance frequencies 715. In another embodiment, the method selects values for second decoupling components corresponding to the active device operating frequencies 715. In still another embodiment, the method selects values for third decoupling components corresponding to one or more harmonics of the active device operating frequencies 715. The method may also select additional values for decoupling components corresponding to additional board resonance frequencies, active device operating frequencies or harmonics, or interaction resonance frequencies 715.

In an embodiment where the electrical interconnection device has approximately a rectangular shape, the first dimension corresponds to an effective length and the second dimension corresponds to an effective width. The preferred locations for placing decoupling components corresponding to the board resonance frequencies for the first and second dimensions include the edges along the length and the width. A preferred location along the dimension includes the midpoint of the dimension.

In one embodiment, selecting appropriate values for decoupling components with resonance frequencies approximately corresponding to the resonance frequencies of the power distribution system 715 includes selecting the number of each of the decoupling components. The number of each of the decoupling components is chosen in one embodiment based upon the frequency range of interest and the impedance profiles of the plurality of possible decoupling components. In another embodiment, the numbers are chosen by a computer system. The computer system may access a database of values on the plurality possible decoupling components, including values for physical and/or electrical characteristics. Electrical characteristics included in the database may include rated capacitance, equivalent series resistance, and/or mounted inductance.

In another embodiment, the method for selecting decoupling components and placing the decoupling components in the model further comprises effectuating the model and determining the system impedance response at one or more selected locations. If the system impedance response at the one or more selected locations is above a target impedance, the method selects additional decoupling components in the proper frequency range. The method places the additional decoupling components in available locations. The available locations may be constrained due to existing devices on the electrical interconnection apparatus, including other decoupling components.

In still another embodiment, the method may include comparing an impedance of each particular one of the decoupling components chosen by the method to the target impedance. The method may further select a number of each particular one of a decoupling components to provide a total impedance at or below the target impedance as a part of selecting appropriate decoupling components 715. In yet another embodiment, the method selects decoupling components above the lowest board resonance frequency. In another embodiment, the method also selects decoupling components above a highest resonance frequency of the decoupling components. Additional details on selecting particular decoupling components and the number of each particular one of the decoupling components may be found elsewhere in this disclosure. Although the method is shown in flowchart form, it is noted that portions of FIG. 7 may occur concurrently or in different orders.

Figure 8A:
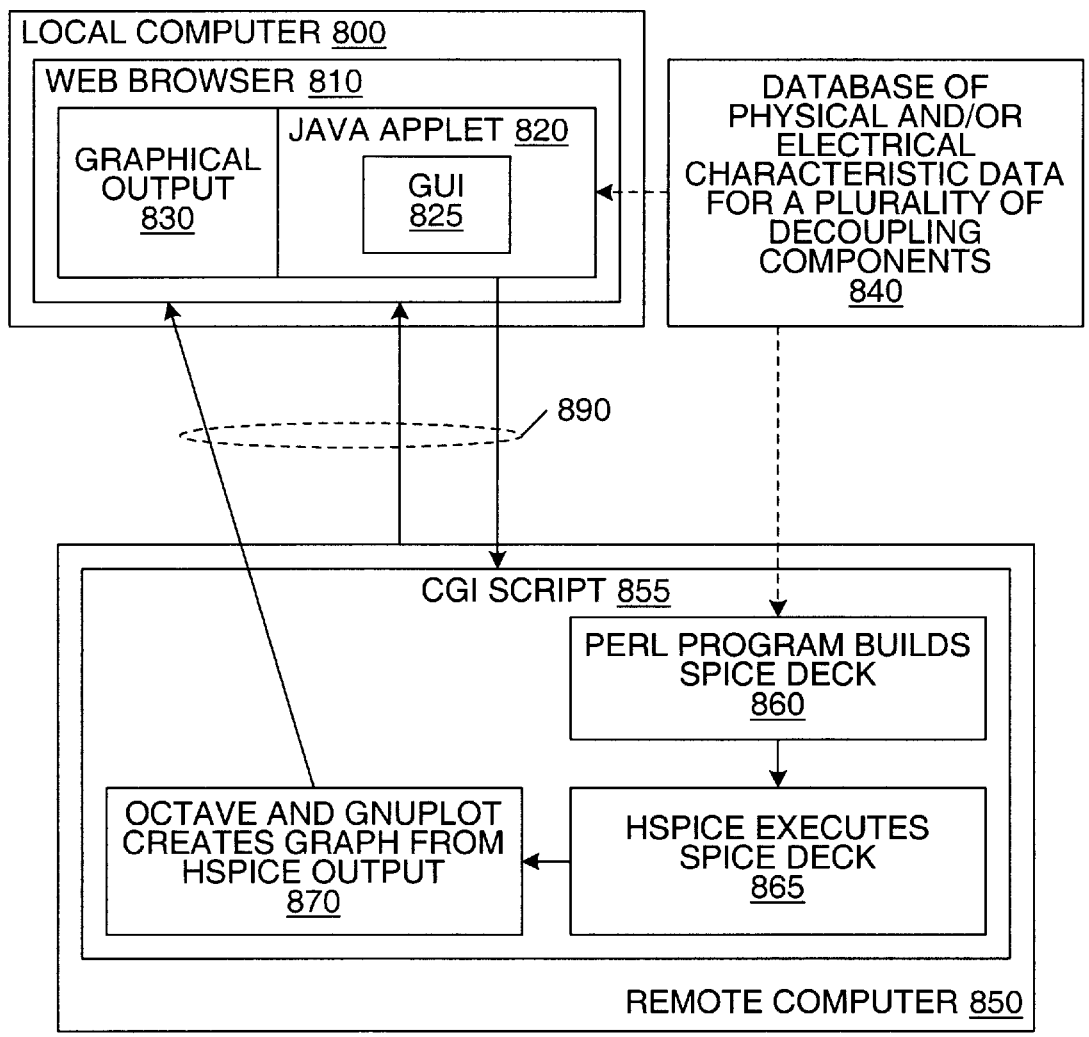
FIG. 8A is a block diagram of an embodiment of a computer system operable to implement the methods of determining the decoupling components for a power distribution system.
Figure 8B:
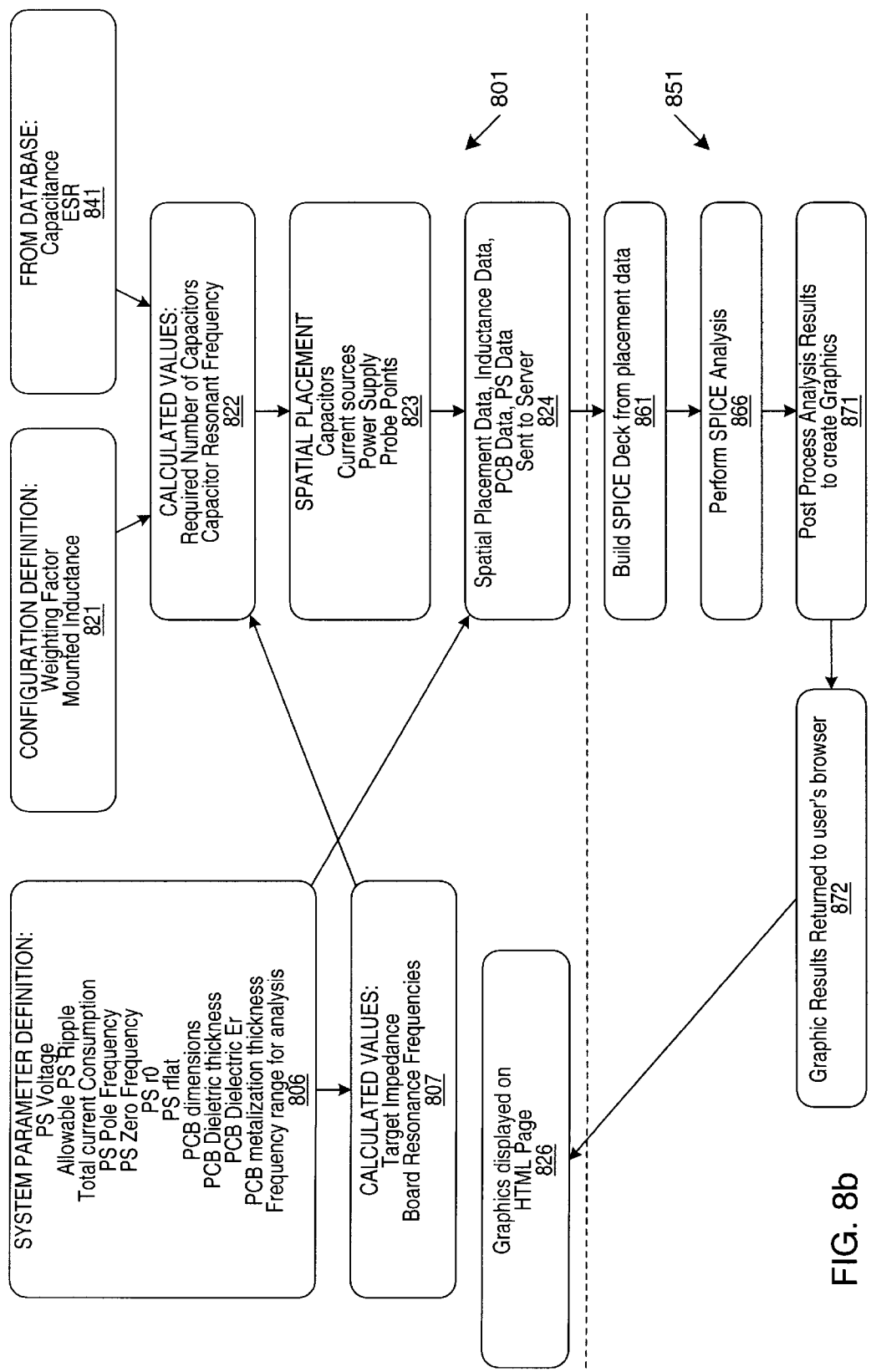
FIG. 8B is a flowchart of an embodiment of the method for determining decoupling components for a power distribution system using the computer system of FIG. 8A.

FIGS. 8A–8B—Computer System and Method for Selecting Decoupling Components

FIG. 8A illustrates a block diagram of an embodiment of a computer system for selecting decoupling components. As shown, the computer system includes a local computer 800 and a remote computer 850 coupled by a networking connection 890. In one embodiment, the local computer 800 and the remote computer 850 are unified as a single computer, where the networking connection 890 comprises a bus in the single computer. Both the local computer 800 and the remote computer 850 are operable to accept input from a database of physical and/or electrical characteristic data for a plurality of decoupling components 840. In various embodiments, the database may be comprised in the local computer 800 or in remote computer 850. In a preferred embodiment, the database is comprised in remote computer 850 and accessible to the local computer 800 through the networking connection 890. In another embodiment, the database 840 is comprised external to both the local computer 800 and the remote computer 850, such as on a database computer.

As shown, the local computer 800 is operable execute a first program, preferably a web browser 810. The web browser 810 is operable to run an interactive applet 820, preferably a JAVA applet, and to accept and display graphical output 830. Alternative embodiments may comprise a JavaScript program or HTML code. The JAVA applet 820 outputs component and placement data using the http POST method to the remote computer. The CGI script 855 receives the component and placement data and either includes or calls a PERL program to build a SPICE deck 860. In other embodiments, CORBA, remote method invocation (RMI), or other methods may be used. The SPICE deck output of the PERL program 860 is sent to a simultaneous-equation-solver program, preferably a SPICE simulator such as HSPICE (available from Avant! Corporation, Fremont, Calif.), which executes the SPICE deck 865. The HSPICE output is preferably converted by OCTAVE and GNUPlot into a graph 870. The graph from 870 is preferably sent from the remote computer 850 to the local computer 800 to be displayed as graphic output 830 in the web browser 810. The actions of the CGI script 855 may also be performed by a second program. In one embodiment, the second program comprises the simultaneous-equation-solver program. In another embodiment, the simultaneous equation solver program comprises a circuit-solver program. Other embodiments of the second programs are also contemplated, including custom hardware or software.

FIG. 8B illustrates a flowchart of an embodiment of a method for determining decoupling components for a power distribution system, preferably using the computer system of FIG. 8A. Actions 801 (above the line) preferably take place on the local computer 800. Actions 851 (below the line) preferably take place on the remote computer 850. In one embodiment, the actions 801 and 851 all take place in a single computer system. In another embodiment, the actions 801 and 851 take place outside the computer system. Systems parameters are defined in 806. Preferably, the system parameters include power supply voltage, allowable power supply ripple, total current consumption, power supply poll frequency, power supply zero frequency, first and second power supply resistances, physical dimensions of the electrical interconnection device, dielectric thickness and constant, metalization thickness of the electrical interconnection device, and the frequency range of interest.

The system parameters defined in 806 are used to calculate values for the target impedance and one or more board resonance frequencies 807. Configuration parameters are defined in 821. The integration parameters preferably include weighting factors and mounted inductances for the plurality of decoupling components. For purposes of this disclosure, mounted inductance refers to a loop inductance based on the geometry of the decoupling components, pad geometry, distance to the power planes, and the location on the power planes. Values are extracted from the database of various physical and/or electrical characteristics for a plurality of decoupling components 841. As shown, the database preferably includes the capacitance and ESR for the plurality of possible decoupling components.

The calculated values 807, the configuration definitions 821, and the database values 841 are input to calculate the decoupling component resonance frequencies, and the optimum number of each chosen decoupling component 822. In one embodiment, the optimum number of each chosen decoupling component chosen for given frequency is the ESR of the decoupling component divided by the target impedance multiplied by the weighting factor. The decoupling component frequencies are preferably calculated using the equation given above.

Spatial placements for decoupling components, current sources, power supply, and selected locations or probe points are chosen in 823, preferably by a user. Further details on placing the decoupling components in the model of the power distribution system are given elsewhere in this disclosure. Spatial placement data 823 and system parameter definitions 806 are combined into spatial placement data, inductance data, electric interconnection device data, and power supply data 824 to be sent to the remote computer 850.

The data that were sent to the remote computer 824 are used to build a SPICE deck 861. The SPICE deck is used as input for a SPICE analysis 866, preferably using HSPICE. Output from the SPICE analysis 866 is processed to create graphical output 871. The graph the output returned to the local computer 872, preferably to the web browser 810. The graphic display is preferably displayed on the local computer 826, preferably as an HTML page in the web browser 810. In one embodiment, the HTML page comprises an SGML page, or other program as desired. Although the method is shown in flowchart form, it is noted that portions of FIG. 8B may occur concurrently or in different orders.

Figure 9:
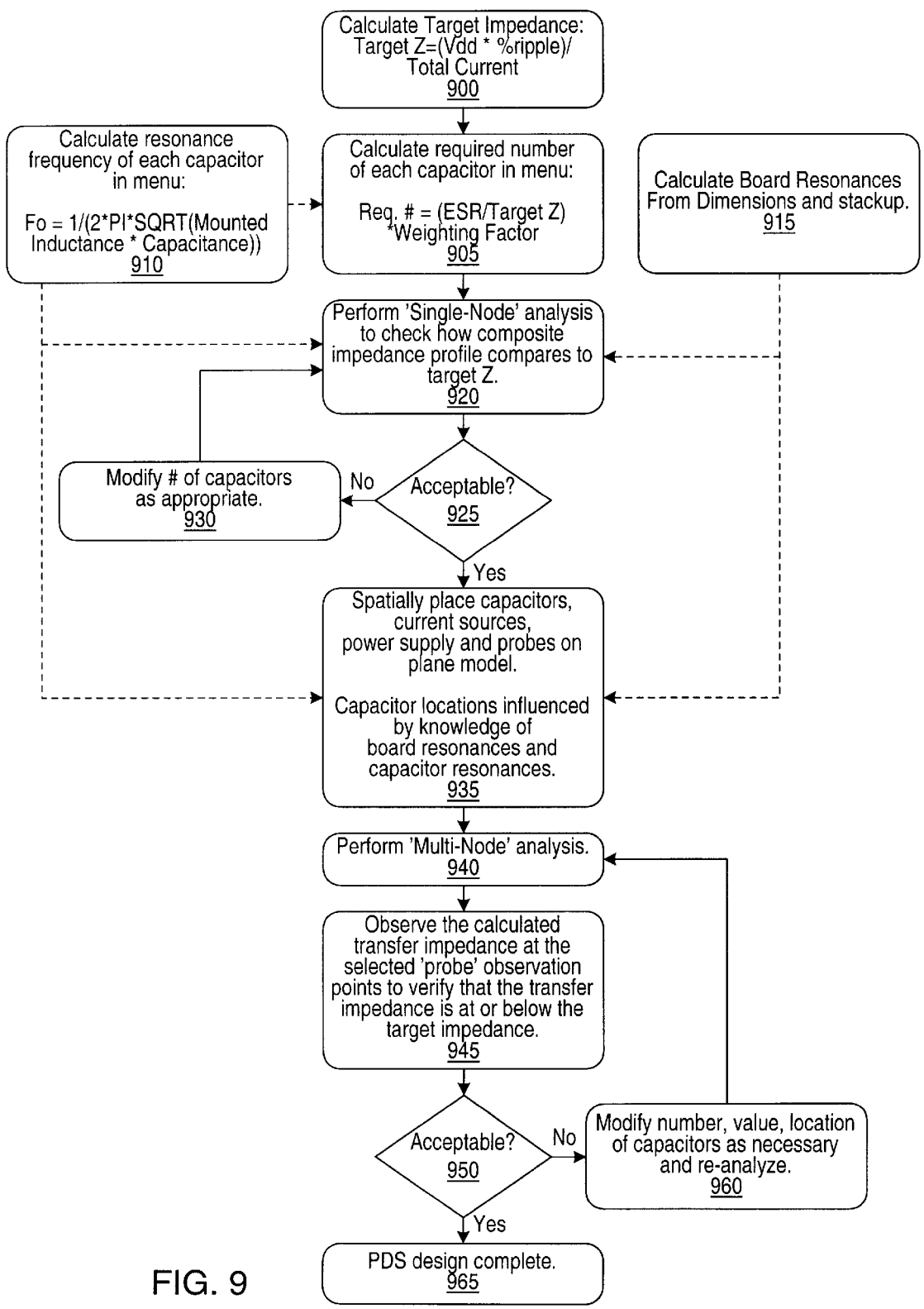
FIG. 9 is a flowchart of another embodiment of the method for determining decoupling components for a power distribution system using the computer system of FIG. 8A.

FIG. 9—Another Embodiment of the Computerized Method

FIG. 9 illustrates a flowchart of an embodiment of a computerized method for determining the decoupling components for a power distribution system. As shown, the method calculates the target impedance for the power distribution system 900. The target impedance is preferably calculated as a power supply voltage times the allowable power supply ripple divided by the total current. In a preferred embodiment, the total current is normalized to one ampere. The calculated target impedance is used to calculate an optimum number of each available decoupling component 905. The optimum number is preferably defined as the ESR of the decoupling component divided by the target impedance multiplied by the weighting factor. The method also calculates the resonance frequency of each available decoupling component 910. The resonance frequency is preferably calculated as the inverse of two pi multiplied by the square root of the product of the mounted inductance and the capacitance of the decoupling component. The method also calculates board resonance frequencies 915, preferably based upon the dimensions of the electrical interconnection device and stackup on the electrical interconnection device.

Figure 2:
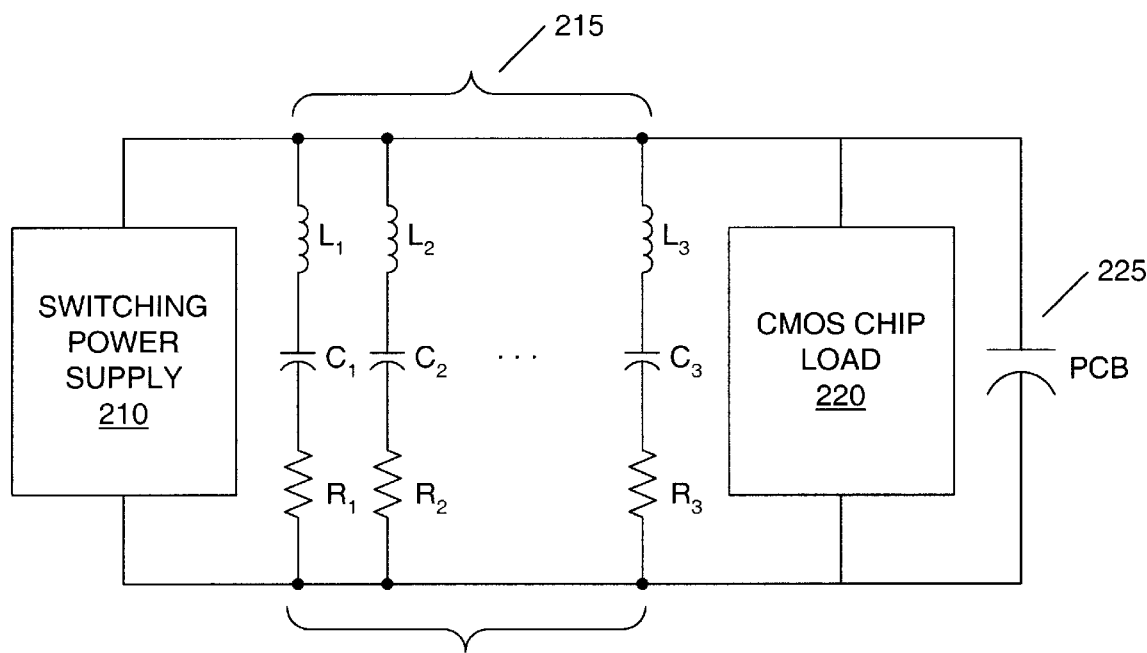
FIG. 2 is an embodiment of a prior art single node model of a power distribution system.
Figure 3:
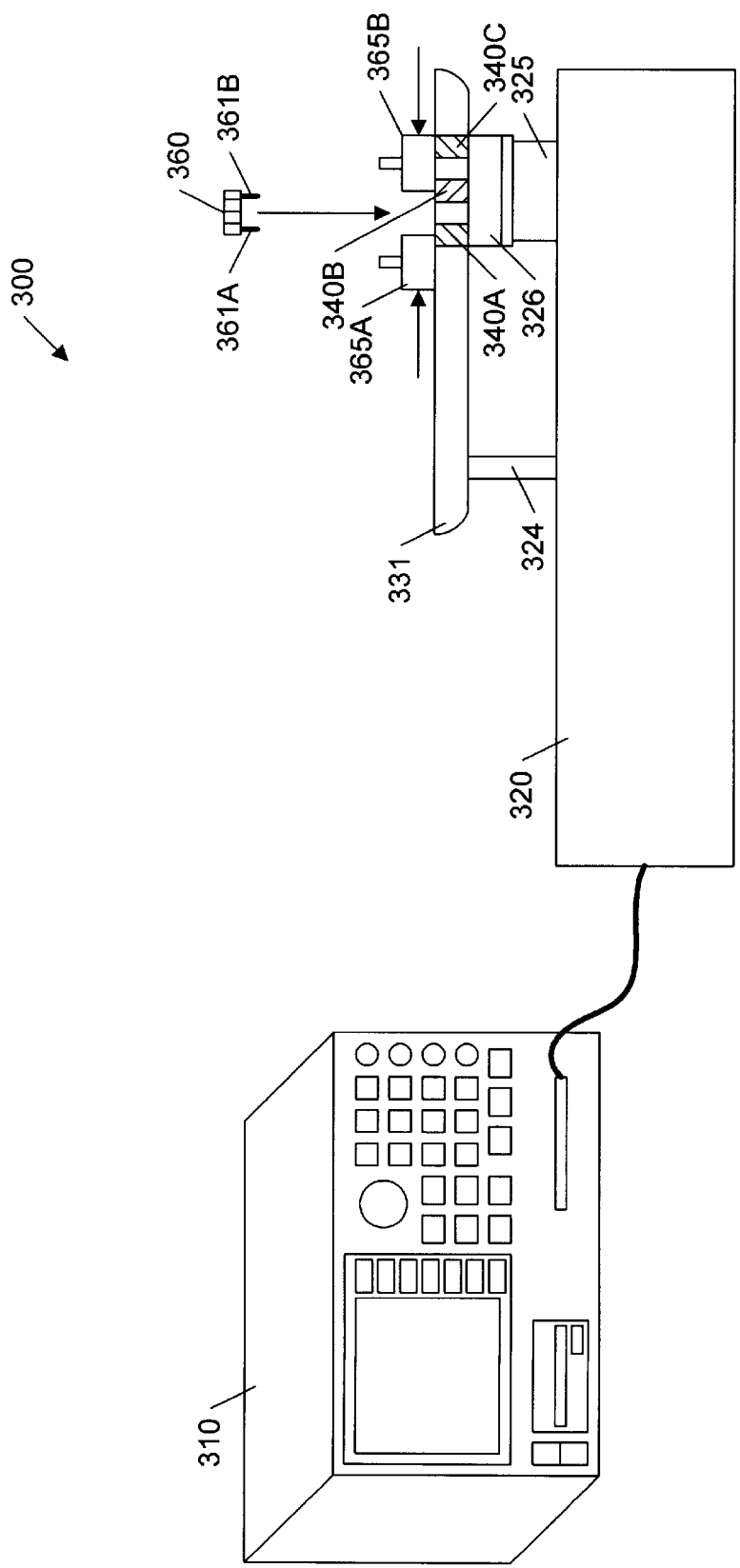
FIG. 3 is an embodiment of a prior art system for measuring the equivalent series resistance of a capacitor.

The method performs single node analysis to compare the composite impedance profile of the electrical interconnection device, including decoupling components, to target impedance. In single node analysis, spatial locations are not taken into account, as in the model illustrated in FIG. 2. The method next compares the results of the single node analysis to the target impedance 925 to determine if the composite impedance profile of the electrical interconnection device is acceptable. Acceptable is preferably defined as the target composite impedance profile being at or below the target impedance. If the composite impedance profile of the electrical interconnection device is not acceptable, the method varies one or more of the input parameters 930 and again performs single node analysis 920.

If the composite impedance profile of the electrical interconnection device after single node analysis is acceptable 925, then the method proceeds to spatially place the decoupling components, the current sources, the power supply, and the specific probe locations in the model 935. The locations chosen for devices placed in the model are preferably influenced by the board resonance frequencies 910 and the capacitor resonance frequencies 915. Additional details on placing decoupling opponents for the power distribution system are given elsewhere in this disclosure.

The method next performs multi-node analysis 940. In a preferred embodiment, multi-node analysis corresponds to performing HSPICE analysis 866. The results of the multi-node analysis are observed 945. If the results are acceptable in 950, the power distribution design is considered complete 965. The preferred criteria for accepting the results of the multi-node analysis are that the system transfer impedance is below the target impedance over the frequency range of interest. Should results not be acceptable in 950, method modifies the choice of the decoupling components, the number of each the decoupling opponents, and/or placement of the decoupling components 960 and reanalyzes the model using multi-node analysis 940. Although the method is shown in flowchart form, it is noted that portions of FIG. 9 may occur concurrently or in different orders.

Numerous variations and modifications will become apparent to those skilled in the art once the above disclosure is fully appreciated. It is intended that the following claims be interpreted to embrace all such variations and modifications.

What is claimed is:

1. A system for measuring equivalent series resistance of a capacitor, the system comprising:

a measuring unit configured to measure impedance over a frequency range to find the equivalent series resistance of the capacitor, wherein the measuring unit includes an input/output (I/O) port; and a connector assembly having a mating portion adapted for electrically connecting the connector assembly to the I/O port of the measuring unit, wherein the connector assembly further includes a terminal portion connected to leads of the capacitor using conductive adhesive;

wherein the measuring unit is calibrated with the mating portion of the connector assembly connected to the input/output port of the measuring unit.

2. The system of claim 1, wherein the measuring unit is a computer connected to an impedance analyzer.

3. The system of claim 1, wherein the conductive adhesive is solder.

4. The system of claim 3, wherein the solder is heat activated.

5. The system of claim 3, wherein the solder is a cold solder.

6. The system of claim 5, wherein the cold solder is chemically activated.

7. The system of claim 1, wherein the conductive adhesive is a removable putty.

8. A method for measuring equivalent series resistance of a capacitor using an impedance analyzer including an input/output port, the method comprising:

connecting a mating portion of a connector assembly to the input/output port of the impedance analyzer;

calibrating the impedance analyzer, wherein the impedance analyzer is calibrated with the connector assembly connected to the input/output port of the impedance analyzer;

connecting leads of the capacitor to a terminal portion of the connector assembly with a conductive adhesive; and sweeping a frequency range with the impedance analyzer to find the equivalent series resistance of the capacitor.

9. The method of claim 8, wherein said calibrating the impedance analyzer includes calibrating with a short, an open, and a test load with known impedance.

10. The method of claim 8, wherein said sweeping a frequency range with the impedance analyzer includes performing multiple sweeps through the frequency range with the impedance analyzer and averaging results of the multiple sweeps.

11. The method of claim 8, further comprising:

checking the calibration of the impedance analyzer after said sweeping.

12. The method of claim 11, wherein said checking the calibration of the impedance analyzer includes comparing a phase shift at the minimum impedance with approximately 180 degrees from a reference baseline.

13. A method for measuring an equivalent series resistance of each of a number of equivalent capacitors using an impedance analyzer including an input/output port, the method comprising:

connecting a mating portion of a connector assembly to the input/output port of the impedance analyzer;

calibrating the impedance analyzer, wherein the impedance analyzer is calibrated with the connector assembly connected to the input/output port of the impedance analyzer;

connecting the number of capacitors in series between contacts on a terminal portion of the connector assembly using a conductive adhesive;

sweeping a frequency range with the impedance analyzer to find the minimum impedance for the number of capacitors; and determining the equivalent series resistance of each of the number of capacitors by dividing the minimum impedance by the number of capacitors.

14. A method for determining decoupling components for a power distribution system, the method comprising:

determining a target impedance for the power distribution system;

selecting one or more specific values of an electrical characteristic associated with decoupling components to be placed in the power distribution system;

measuring an equivalent series resistance of each of the one or more decoupling components, wherein said measuring the equivalent series resistance includes:

connecting a mating portion of a connector assembly to an input/output port of an impedance analyzer;

calibrating the impedance analyzer, wherein the impedance analyzer is calibrated with the connector assembly connected to the input/output port of the impedance analyzer;

connecting leads of a respective decoupling component to a terminal portion of the connecting assembly with a conductive adhesive; and sweeping a frequency range with the impedance analyzer to find the equivalent series resistance of the respective decoupling component; and determining the number of decoupling components of each specific value to be placed in the power distribution system; and placing the decoupling components in the power distribution system in response to said determining the number of decoupling components.

15. The method of claim 14, wherein the number of decoupling components of each specific value is determined by choosing the smallest integer number of decoupling components which, when coupled in parallel, results in an impedance which is closest to but not greater than the target impedance.

16. The method of claim 14, wherein the number of decoupling components of each specific value is determined by choosing the smallest integer number with a value closest to but not less than the quotient obtained by dividing the equivalent series resistance of the respective decoupling component by the target impedance.

17. A method for determining decoupling components for a power distribution system for a given frequency, wherein the power distribution system includes a target impedance, the method comprising:

measuring an equivalent series resistance of a plurality of decoupling components, wherein said measuring the equivalent series resistance includes:

connecting a mating portion of a connector assembly to an input/output port of an impedance analyzer;

calibrating the impedance analyzer, wherein the impedance analyzer is calibrated with the connector assembly connected to the input/output port of the impedance analyzer;

connecting, in turn, leads of one of the plurality of decoupling components to a terminal portion of the connector assembly with a conductive adhesive; and sweeping a frequency range with the impedance analyzer to find the equivalent series resistance for the one of the plurality of decoupling components;

selecting a particular one of the plurality of decoupling components, wherein the particular one has an associated resonance frequency approximately equal to the given frequency;

comparing the equivalent series resistance of the particular one of the decoupling components to the target impedance;

determining the number of the particular one of the plurality of decoupling components to be used in the power distribution system; and placing the decoupling components in the power distribution system in response to said determining the number of the particular one of the plurality of decoupling components to be used.

18. The method of claim 17, wherein the number of the particular one of the plurality of decoupling components is determined by choosing the smallest integer number with a value closest to but not greater than the quotient obtained by dividing the equivalent series resistance of the particular one of the plurality of decoupling components by the target impedance.

19. The method of claim 17, wherein the given frequency comprises a frequency range, the method further comprising:

selecting a next particular one of the plurality of decoupling components, wherein the next particular one includes a new resonance frequency different from the resonance frequency of each previously selected particular one of the plurality of decoupling components, wherein the new resonance frequency is within the frequency range;

comparing the equivalent series resistance of the next particular one of the decoupling components to the target impedance; and determining the number of the next particular one of the plurality of decoupling components to be used in the power distribution system; and placing the number of the next particular one of the plurality of decoupling components in the power distribution system in response to said determining the number of the next particular one of the plurality of decoupling components to be used.

20. The method of claim 19, wherein the number of the particular one of the plurality of decoupling components is determined by choosing the smallest integer number with a value closest to but not greater than the quotient obtained by dividing the equivalent series resistance of the particular one of the plurality of decoupling components by the target impedance.

* * * * *